(12) United States Patent
Zhou et al.

(10) Patent No.: US 9,374,090 B2
(45) Date of Patent: Jun. 21, 2016

(54) CIRCUIT ARRANGEMENT AND METHOD OF OPERATING THE SAME

(71) Applicant: Agency for Science, Technology and Research, Singapore (SG)

(72) Inventors: Jun Zhou, Singapore (SG); Chao Wang, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 14/895,758

(22) PCT Filed: Jun. 4, 2014

(86) PCT No.: PCT/SG2014/000257
§ 371 (c)(1),
(2) Date: Dec. 3, 2015

(87) PCT Pub. No.: WO2014/200429
PCT Pub. Date: Dec. 18, 2014

(65) Prior Publication Data
US 2016/0118985 A1    Apr. 28, 2016

(30) Foreign Application Priority Data
Jun. 11, 2013  (SG) .................... 201304500-0

(51) Int. Cl.
*H03K 19/00*     (2006.01)
*H03K 19/0175*   (2006.01)

(52) U.S. Cl.
CPC .... *H03K 19/0013* (2013.01); *H03K 19/017509* (2013.01)

(58) Field of Classification Search
None
See application file for complete search history.

(56) References Cited

U.S. PATENT DOCUMENTS

| 4,622,480 A  * | 11/1986 | Uchimura ............ G11C 27/024 327/337 |
| 5,517,148 A  * | 5/1996  | Yin ....................... H03F 1/0222 326/68 |
| 6,304,132 B1 * | 10/2001 | Nayebi ................. H03L 7/0895 323/316 |
| 7,173,473 B2   | 2/2007  | Terletzki et al. |
| 7,317,333 B1 * | 1/2008  | Zhou .................. H03K 19/0013 326/80 |
| 7,821,316 B2 * | 10/2010 | Fiedler ..................... G06F 1/06 327/158 |

(Continued)

OTHER PUBLICATIONS

Lin et al., "Single Stage Static Level Shifter Design for Subthreshold to I/O Voltage Conversion," Low Power Electronics and Design (ISLPED), 2008 ACM/IEEE International Symposium, Aug. 2008, pp. 197-200.

(Continued)

*Primary Examiner* — Crystal L Hammond
(74) *Attorney, Agent, or Firm* — Winstead, P.C.

(57) ABSTRACT

A circuit arrangement may be provided including a level shifting stage configured to be coupled to a first reference voltage and a second reference voltage. The circuit arrangement may also include a first input electrode in electrical connection with the level shifting stage for coupling a first input voltage and a second input electrode in electrical connection with the level shifting stage for coupling a second input voltage. The level shifting stage may be configured to generate an output voltage above a predetermined output level at the output node due to the first reference voltage when the first input voltage is in the first logic state and the second input voltage is in the second logic state. The circuit arrangement may also include a feedback circuit coupled to the output stage and the level shifting stage and a voltage stabilization circuit coupled to the level shifting stage.

20 Claims, 14 Drawing Sheets

FIG. 6

(56) References Cited

U.S. PATENT DOCUMENTS

| | | | |
|---|---|---|---|
| 7,924,080 B2 | 4/2011 | Uchino et al. | |
| 2008/0204109 A1* | 8/2008 | Pilling | H03K 19/0013 327/333 |
| 2012/0299631 A1 | 11/2012 | Duby et al. | |
| 2013/0321027 A1* | 12/2013 | Zhou | H03K 19/017509 326/81 |

OTHER PUBLICATIONS

Wooters et al., "An Energy-Efficient Subthreshold Level Converter in 130-nm CMOS," Circuits and Systems II: Express Briefs, IEEE Transactions, vol. 57, No. 4, Apr. 2010, pp. 290-294.

Hsueh et al., "Inverse-Narrow-Width Effects and Small-Geometry MOSFET Threshold Voltage Model," Electron Devices, IEEE Transactions, vol. 35, No. 3, Mar. 1988, pp. 325-338.

Lutkemeier et al., "A Subthreshold to Above-Threshold Level Shifter Comprising a Wilson Current Mirror," IEEE Trans. Circuits and Systems-II, vol. 57, No. 9, 2010, pp. 721-724.

Kim et al., "LC2: Limited Contention Level Converter for Robust Wide-Range Voltage Conversion," VLSI Circuits (VLSIC), 2011 Symposium, Jun. 2011, pp. 188-189.

Osaki et al., "A Low-Power Level Shifter With Logic Error Correction for Extremely Low-Voltage Digital CMOS LSIs," Solid-State Circuits, IEEE Journal, vol. 47, No. 7, Jul. 2012, pp. 1776-1783.

International Preliminary Report on Patentability for International Application No. PCT/SG2014/000257 dated Dec. 15, 2015, pp. 1-5.

Written Opinion for International Application No. PCT/SG2014/000257 dated Aug. 18, 2014, pp. 1-3.

\* cited by examiner

PRIOR ART

FIG. 12

| VDD (V) | LS from [4] | | | Proposed LS | | |
|---|---|---|---|---|---|---|
| | Delay (us) | Active Energy (fJ) | Leakage Power (pW) | Delay (ns) | Active Energy (fJ) | Leakage Power (pW) |
| 0.6 | 1041 | 2 | 421 | 350 | 2 | 27 |
| 0.8 | 339 | 30 | 717 | 186 | 4 | 42 |
| 1.0 | 214 | 139 | 1112 | 157 | 5 | 57 |
| 1.2 | 178 | 354 | 1624 | 147 | 7 | 72 |
| 1.4 | 168 | 714 | 2269 | 145 | 10 | 90 |
| 1.6 | 171 | 1765 | 3066 | 145 | 17 | 111 |
| 1.8 | 197 | 2937 | 4034 | 146 | 36 | 135 |
| 2.0 | | | | 146 | 58 | 168 |
| 2.5 | | | | 147 | 174 | 297 |
| 3 | | | | 151 | 515 | 507 |
| 3.3 | | | | 164 | 891 | 842 |

| Parameters | FIG.3 | FIG.6 | FIG.7 | FIG.4 | FIG.9 |
|---|---|---|---|---|---|
| Process Technology | 130 nm | 130 nm | 0.35 um | 0.18 um (Re-implemented at 0.18 um for comparison) | 0.18 um |
| Shifting Range | 0.19 V – 1.2 V | 0.3 V – 2.5 V | 0.23 V – 3 V | 0.2 V – 1.8 V | 0.2 V – 3.3 V |
| Delay | 10 FO4 (0.3 V → 1.2 V) | 2.38 FO4 (0.3 V → 2.5 V) | 10,000 ns (0.4 V → 3V) (FO4 delay not shown in the paper) | 1.23 FO4 (0.3 V → 1.8 V) | 1.02 FO4 (0.3 V → 3.3 V)<br>0.92 FO4 (0.3 V → 2.5 V)<br>0.92 FO4 (0.3 V → 1.8 V) |
| Active Energy Per Transition | Not shown | 229 fJ (0.3 V → 2.5 V) | 5,800 fJ (0.4 V → 3V) | 2.937 fJ (0.3 V → 1.8 V) | 891 fJ (0.3 V → 3.3 V)<br>174 fJ (0.3 V → 2.5 V)<br>36 fJ (0.3 V → 1.8 V) |
| Leakage Power | Not shown | 475 pW (0.3 V → 2.5 V) | 230 pW (0.4 V → 3V) | 4,034 pW (0.3 V → 1.8 V) | 842 pW @ 3.3 V<br>297 pW @ 2.5 V<br>135 pW @ 1.8 V |
| Delay with 3σ PVT Variation | Not shown | 4.76 FO4 (0.3 V → 2.5 V) | Not shown | 3.14 FO4 (0.3 V → 1.8 V) | 2.31 FO4 (0.3 V → 3.3 V)<br>2.19 FO4 (0.3 V → 2.5 V)<br>2.27 FO4 (0.3 V → 1.8 V) |

FIG. 14

1400 couple a level shifting stage to a first reference voltage and a second reference voltage.
— 1402 couple a first input voltage to a first input electrode in electrical connection with the level shifting stage
— 1404 couple a second input voltage to a second input electrode in electrical connection with the level shifting stage
— 1406

CIRCUIT ARRANGEMENT AND METHOD OF OPERATING THE SAME

CROSS-REFERENCE TO RELATED APPLICATIONS

This application claims the benefit of priority of SG application No. 201304500-0 filed Jun. 11, 2013, the contents of it being hereby incorporated by reference in its entirety for all purposes.

TECHNICAL FIELD

Various aspects of this disclosure relate to circuit arrangements and methods of operating the same.

BACKGROUND

Voltage scaling has been used to reduce the power consumption of digital and analog circuits. It has been found that minimal energy may be achieved when the supply voltage is lowered to around or below the threshold voltage of transistors.

Future low power systems on chips (SOCs) are likely to include many components or cores operating at sub-threshold voltages to super-threshold voltages. The number of components or cores may be in hundreds. This requires hundreds to thousands of level shifters to be inserted between different power domains including the cores and the input/output (I/O). The level shifters are required to conduct wide ranging level shifting from sub-threshold up to IO voltage level with short delays and low energy consumption.

SUMMARY

In various embodiments, a circuit arrangement may be provided. The circuit arrangement may include a level shifting stage configured to be coupled to a first reference voltage and a second reference voltage. The circuit arrangement may also include a first input electrode in electrical connection with the level shifting stage for coupling a first input voltage. The first input voltage may be configured to switch between a first logic state and a second logic state. The circuit arrangement may further include a second input electrode in electrical connection with the level shifting stage for coupling a second input voltage. The second input voltage may be configured to switch between the first logic state and the second logic state. The circuit arrangement may additionally include an output stage coupled to the level shifting stage, the output stage including an output node. The level shifting stage may be configured to generate an output voltage above a predetermined output level at the output node due to the first reference voltage when the first input voltage is in the first logic state and the second input voltage is in the second logic state. The level shifting stage may be further configured to generate the output voltage below the predetermined output level at the output node due to the second reference voltage when the first input voltage is in the second logic state and the second input voltage is in the first logic state. The circuit arrangement may also include a feedback circuit coupled to the output stage and the level shifting stage. The circuit arrangement may additionally include a voltage stabilization circuit coupled to the level shifting stage. The level shifting stage may include a switching mechanism configured to cause an internal current above a predetermined current level to flow through the level shifting stage due to the first reference voltage and the second reference voltage when the switching mechanism is activated. The switching mechanism may be further configured to at least reduce the internal current flowing through the level shifting stage to below the predetermined current level when the switching mechanism is deactivated. The feedback circuit may include a feedback mechanism configured to be deactivated when the output voltage is above the predetermined output level. The feedback mechanism may be further configured to be activated when the output level is below the predetermined output level. The switching mechanism may be configured to be activated when the first input voltage is in the first logic state and when the feedback mechanism is activated. The switching mechanism may be further configured to be deactivated when the first input voltage is in the first logic state and when the feedback mechanism is deactivated. The voltage stabilization circuit may be configured to maintain the output voltage at above the predetermined output level when the internal current flowing through the level shifting stage is reduced.

In various embodiments, a method of operating a circuit arrangement may be provided. The method may include coupling a level shifting stage to a first reference voltage and a second reference voltage. The method may also include coupling a first input voltage to a first input electrode in electrical connection with the level shifting stage. The first input voltage may be configured to switch between a first logic state and a second logic state. The method may further include coupling a second input voltage to a second input electrode in electrical connection with the level shifting stage. The second input voltage may be configured to switch between the first logic state and the second logic state. The level shifting stage may be coupled to an output stage. The output stage may include an output node. The level shifting stage may be configured to generate an output voltage above a predetermined output level at the output node due to the first reference voltage when the first input voltage is in the first logic state and the second input voltage is in the second logic state. The level shifting stage may be further configured to generate the output voltage below the predetermined output level at the output node due to the second reference voltage when the first input voltage is in the second logic state and the second input voltage is in the first logic state. A feedback circuit may be coupled to the output stage and the level shifting stage. A voltage stabilization circuit may be coupled to the level shifting stage. The level shifting stage may include a switching mechanism configured to cause an internal current above a predetermined current level to flow through the level shifting stage due to the first reference voltage and the second reference voltage when the switching mechanism is activated. The switching mechanism may be further configured to at least reduce the internal current flowing through the level shifting stage to below the predetermined current level when the switching mechanism is deactivated. The feedback circuit may include a feedback mechanism configured to be deactivated when the output voltage is above the predetermined output level and the feedback mechanism is further configured to be activated when the output level is below the predetermined output level. The switching mechanism may be configured to be activated when the first input voltage is in the first logic state and when the feedback mechanism is activated. The switching mechanism may be further configured to be deactivated when the first input voltage is in the first logic state and when the feedback mechanism is deactivated. The voltage stabilization circuit may be configured to maintain the output voltage at above the predetermined output level when the internal current flowing through the level shifting stage is reduced.

BRIEF DESCRIPTION OF THE DRAWINGS

The invention will be better understood with reference to the detailed description when considered in conjunction with the non-limiting examples and the accompanying drawings, in which:

FIG. 12 is a table showing simulation results of the delay and energy comparison of the circuit arrangement illustrated in FIG. 9 according to various embodiments and the level shifter illustrated in FIG. 4 at different VDD.

FIG. 13 is a table comparing simulation results of the circuit arrangement illustrated in FIG. 9 according to various embodiments with the level shifters shown in FIGS. 3, 4, 6 and 7.

FIG. 14 shows a schematic illustrating a method of operating a circuit arrangement.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

In order that the invention may be readily understood and put into practical effect, particular embodiments will now be described by way of examples and not limitations, and with reference to the figures.

In various embodiments, a "circuit" may be understood as any kind of a logic implementing entity, which may be special purpose circuitry or a processor executing software stored in a memory, firmware, or any combination thereof. Thus, in various embodiments, a "circuit" may be a hard-wired logic circuit or a programmable logic circuit such as a programmable processor, e.g. a microprocessor (e.g. a Complex Instruction Set Computer (CISC) processor or a Reduced Instruction Set Computer (RISC) processor). A "circuit" may also be a processor executing software, e.g. any kind of computer program, e.g. a computer program using a virtual machine code such as e.g. Java. Any other kind of implementation of the respective functions which will be described in more detail below may also be understood as a "circuit" in accordance with an alternative embodiment.

Figure 1A:
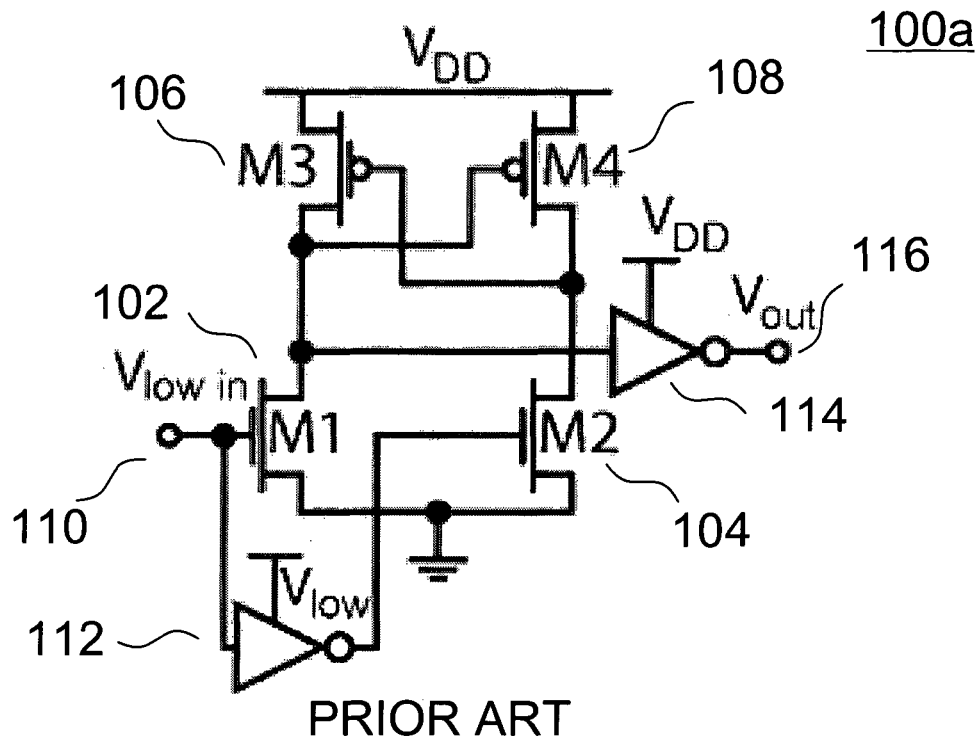
FIG. 1A shows a schematic of a level shifter based on the cross-coupled p-channel metal oxide field effect semiconductor (PMOS) transistors configuration.
Figure 1B:
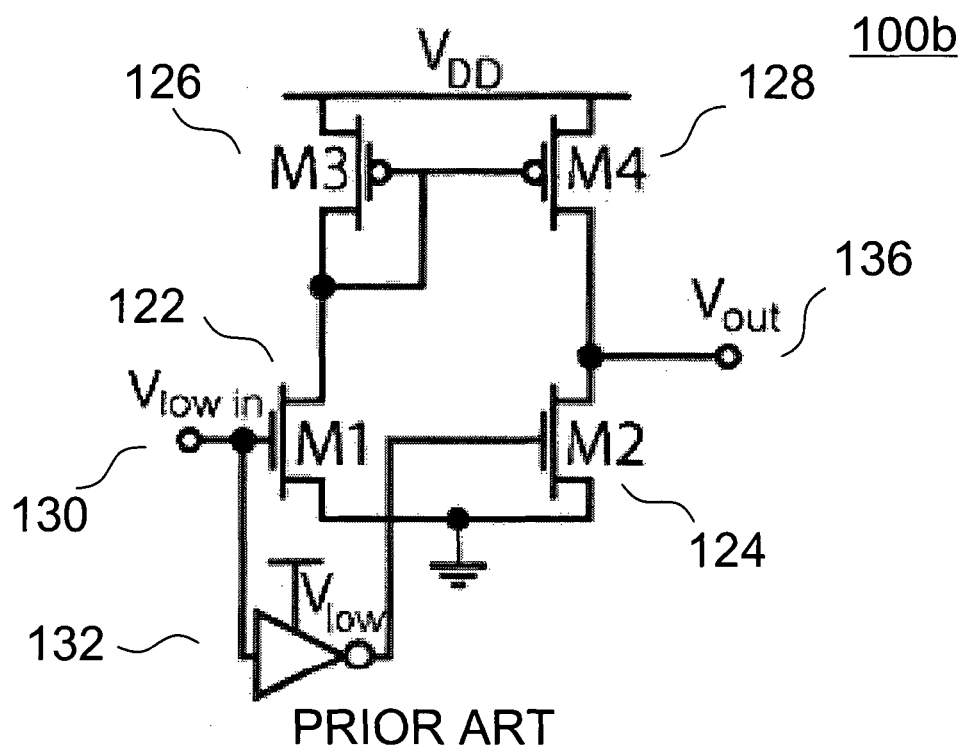
FIG. 1B shows a schematic of a level shifter based on the current mirror configuration.

FIGS. 1A and 1B show schematics two level shifters for super-threshold operations. FIG. 1A shows a schematic 100a of a level shifter based on the cross-coupled p-channel metal oxide field effect semiconductor (PMOS) transistors configuration. The level shifters include two n-channel metal oxide field effect semiconductor (NMOS) transistors 102, 104 and two p-channel metal oxide field effect semiconductor (PMOS) transistors 106, 108. The gate electrodes of the PMOS transistors 106, 108 are coupled to the drain electrode of the NMOS transistors 104, 102 respectively. An input voltage $V_{low,in}$ may be applied to node 110. Node 110 is coupled to the gate electrode of transistor 102. An input inverter 112 (power by voltage $V_{low}$) is used to convert the input voltage to generate an inverted input voltage at the gate electrode of transistor 104. The drain electrodes of transistors 106, 108 are coupled to supply voltage $V_{DD}$. An output inverter 114 may be used to electrically connect the drain electrode of transistor 102 to output node 116. When the voltage $V_{low,in}$ is applied to node 110, an output voltage about $V_{DD}$ may be generated at output node 116. Conversely, when a voltage of about 0 V is applied to node 110, an output voltage about 0V may be generated at output node 116.

This structure works well for input voltages well above threshold voltages. When the input voltage decreases to threshold levels, transistors 102 or 104 are nearly turned off. The pull down current is unable to overcome the pull up current and the level shifter may fail to flip. In other words, the strength of the NMOS transistors 102, 104 may fail to overcome the PMOS that is connected to nominal voltage so the output fails to flip. An intuitive solution is to increase the sizes of transistors 102 and 104. However, this is impractical because when the input voltages applied to transistors 102 or 104, transistors 102 and/or 104 conduct mainly sub-threshold currents which are several times smaller than the super-threshold currents flowing through transistors 106 and/or 108. For example, simulation shows that at 90 nm, transistors 102 and 104 have to be sized 2000 times larger than transistors 106 and 108 for the circuit to operate in the sub-threshold region.

FIG. 1B shows a schematic 100b of a level shifter based on the current mirror configuration. The level shifter uses current-mirror to achieve fast level shifting for ultra-low input voltages. NMOS transistors 122, 124 and PMOS transistors 126, 128 are connected to form a current mirror. An input voltage may be applied at node 130. An input inverter 132 is used to generate an inverted input voltage from the input voltage. An output node 136 may be connected to the drain of transistor 124 to generate an output voltage. When the input voltage is high, there is current flowing through transistors 122, 126. An amplified current flows through transistors 124, 128 and charge the output node 136 to high (e.g. close to supply voltage VDD). When the input voltage is low, the current mirror is disabled and the output is discharged to low (e.g. close to ground). While the level shifter based on the current mirror configuration can operate at a lower supply voltage, there is a constant static current flowing through transistors 122, 126 when the output voltage is high, which results in a large standby leakage power consumption.

Figure 2:
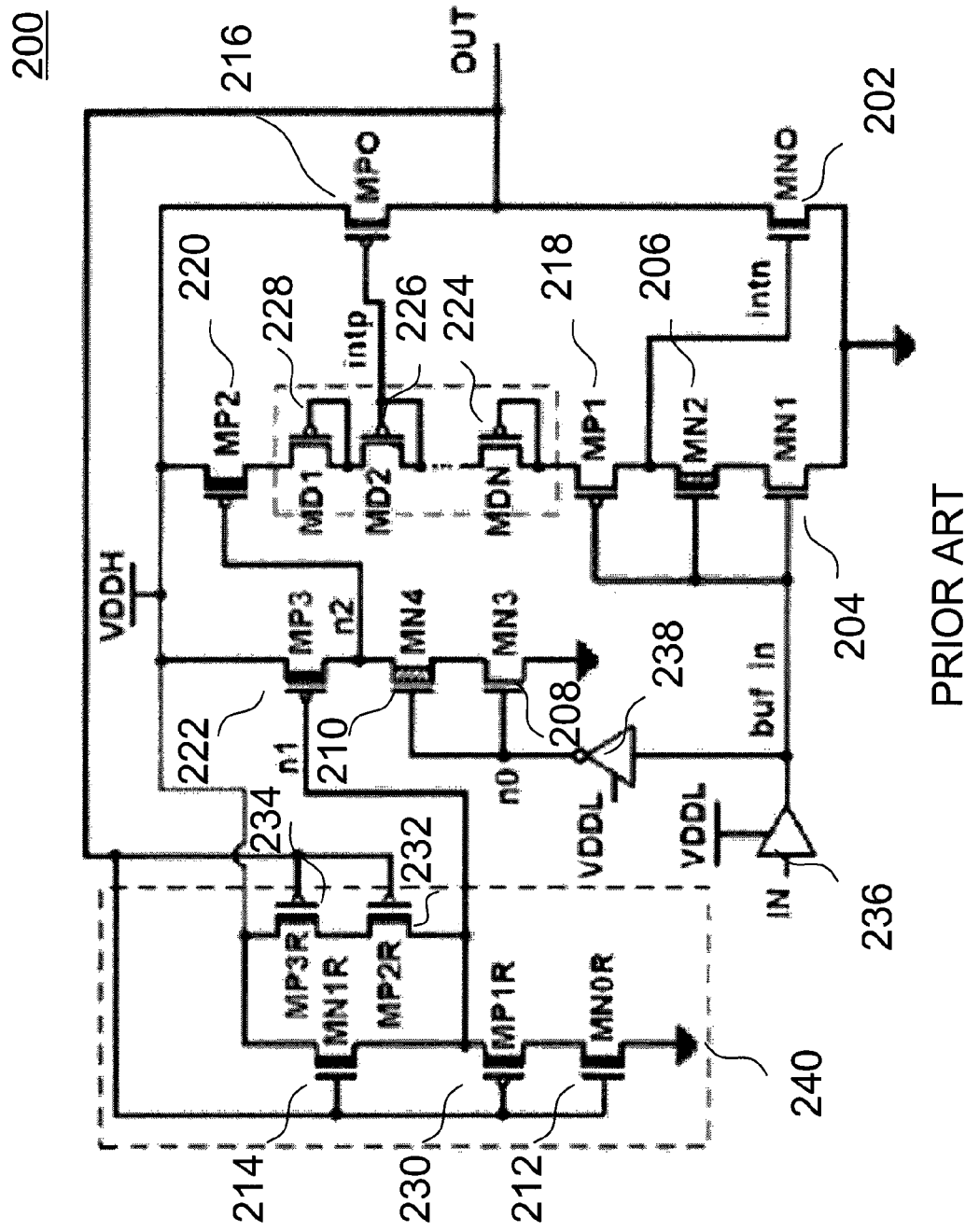
FIG. 2 shows a schematic of a level shifter.

FIG. 2 shows a schematic 200 of a level shifter. The level shifter includes NMOS transistors 202, 204, 206, 208, 210, 212 and 214, PMOS transistors 216, 218, 220, 222, 224, 226, 228, 230, 232, 234 as well as inverters 236, 238. The level shifter includes a reduced swing inverter (RSI) 240 (including transistors 212, 214, 230, 232, 234) to achieve the pull-up path to achieve fast transition without heavily upsizing the pull down transistors. However, this structure uses more than 20 transistors which increase its area overhead and sensitiveness to process variation. Another drawback is that the propagation delay does not scale with voltage very well since the pull-up transistors are constantly weakened.

Figure 3:
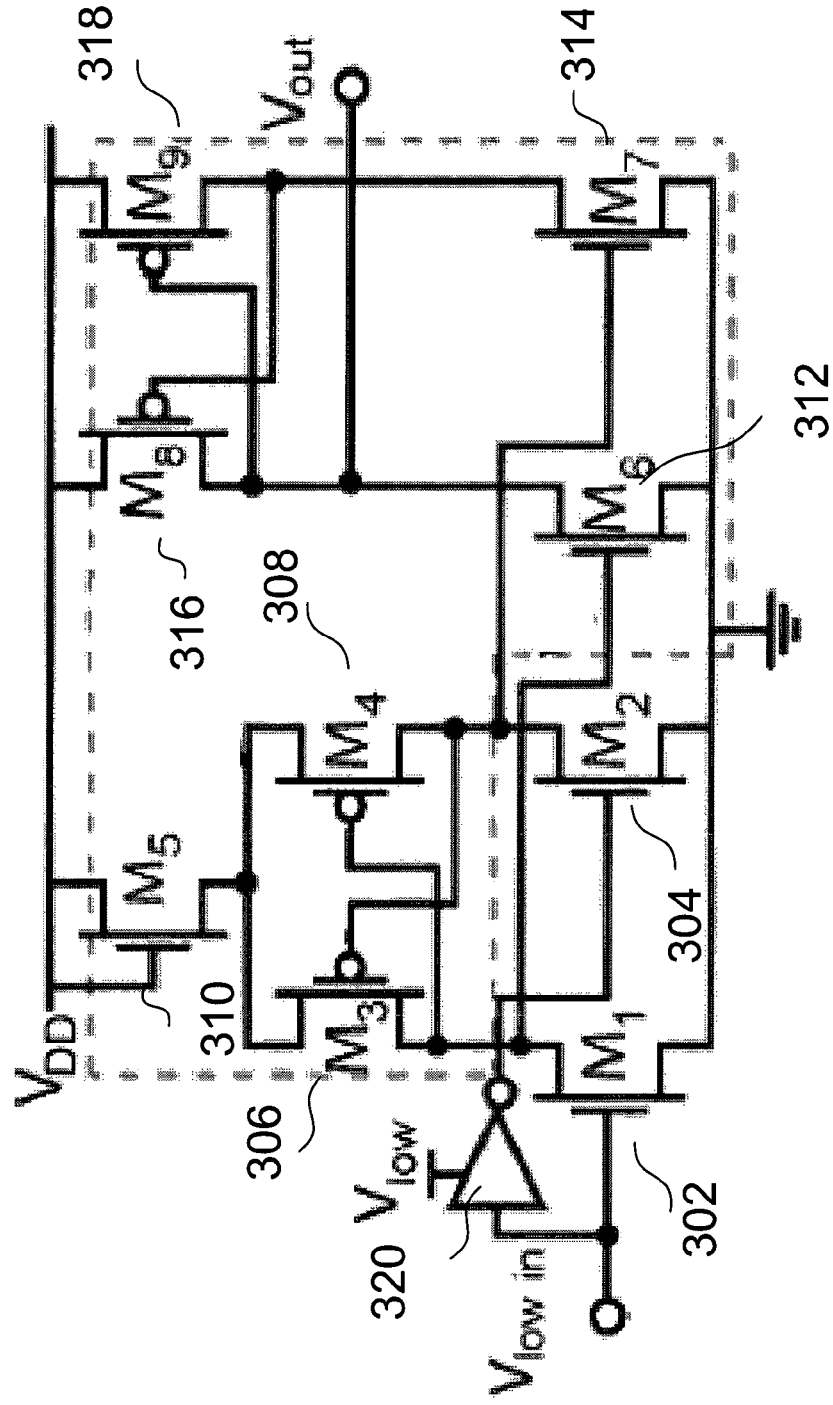
FIG. 3 shows a schematic of a level shifter.

FIG. 3 shows a schematic 300 of a level shifter. The level shifter includes a first stage having NMOS transistors 302, 304 and PMOS transistors 306, 308. A diode connected PMOS transistor 310 acting as a load is used to weaken the pull-up path. The level shifter further includes a second stage cascaded with the first stage to achieve full swing of voltage. The second stage includes NMOS transistors 312, 314 and PMOS transistors 316, 318. The propagation of this level shifter does not scale very well with voltage especially when the supply voltage is raised above the threshold voltage since the drop across PMOS transistor 310 is nearly constant. As such, this level shifter may not be suitable for applications which require dynamic voltage scaling (DVS). Also, the level shifter may suffer from asymmetric rise and fall delay caused by the input inverter 320, especially at ultra low voltages due to the reduced conductance of the cross-coupled PMOS.

Figure 4:
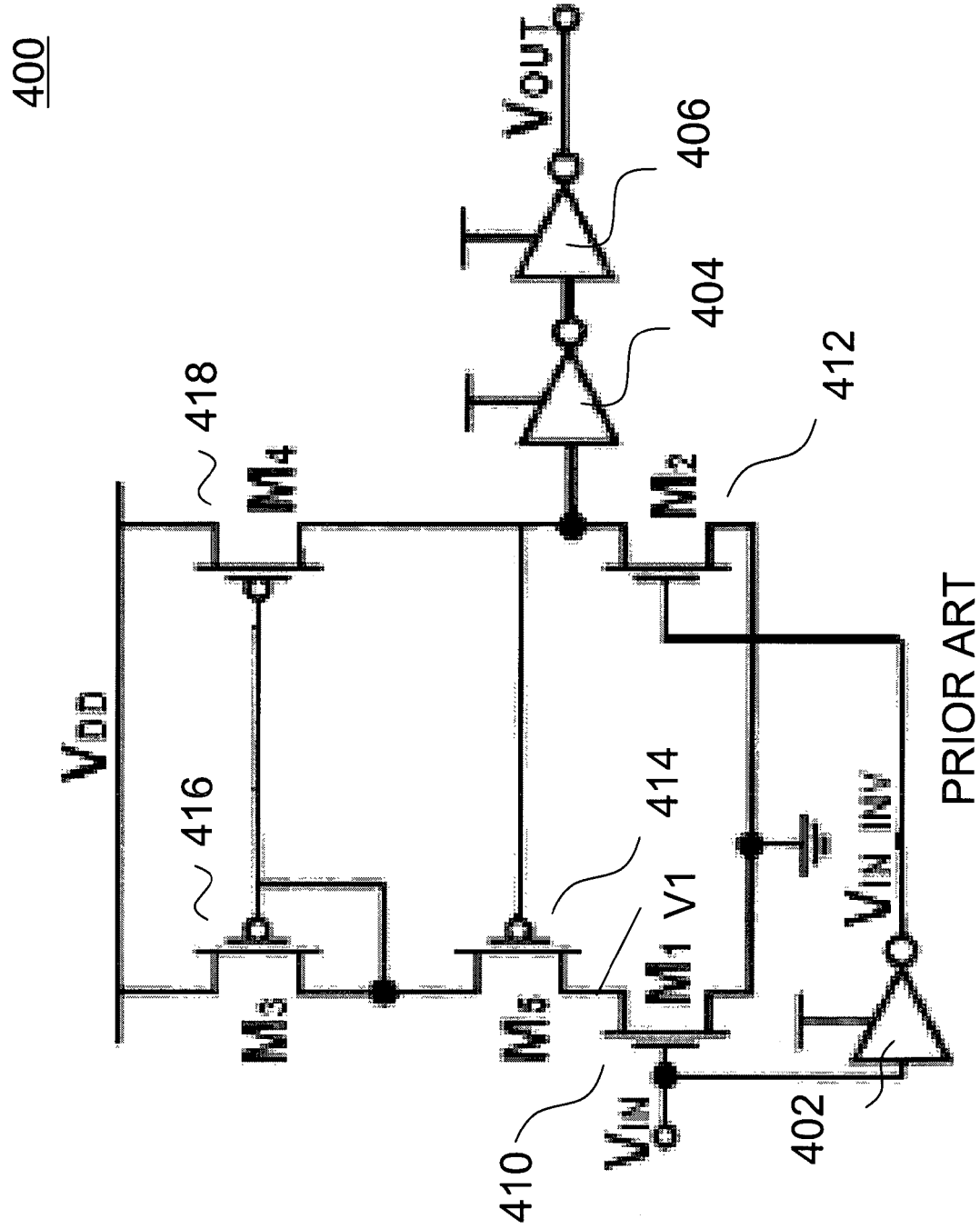
FIG. 4 shows a schematic of a level shifter.

FIG. 4 shows a schematic 400 of a level shifter. The level shifter may include an inverter 402 and a modified current mirror level shifter stage. The modified current mirror level shifter stage may include NMOS transistors 410, 412 as well as PMOS transistors 414, 416, 418. The level shifter may also include an output stage coupled to the modified current mirror level shifter stage. The output buffer stage may include inverters 404, 406. The NMOS transistors 410, 412 as well as PMOS transistors 414, 416, 418 form a Wilson current mirror. The level shifter uses feedback control (i.e. transistor 414) to disable the static current path through transistors 410, 416 to reduce the standby leakage current. However, disabling the static current path causes a voltage drop at the output when the output voltage is high due to the reduced mirror current. The variation of output voltage in turn corrects the mirror current through transistor 414. However, the correction is small because the voltage difference across the gate and source of the feedback transistor 414 is small. The output of the current mirror may finally stabilize at a voltage below VDD. This creates another static current path in the subsequent output buffer stage and high standby leakage. Upsizing transistors 414, 418 may reduce the voltage drop but may increase the delay and power consumption significantly, especially for 1→0 transition. Another drawback observed is for 1→0 transition, transistor 414 is turned on which causes charge sharing from the drain of transistor 416 to node V1. This may lead to a sudden drop at the drain of transistor 416 and a substantial increase in delay and energy for the 1→0 transition.

Figure 5:
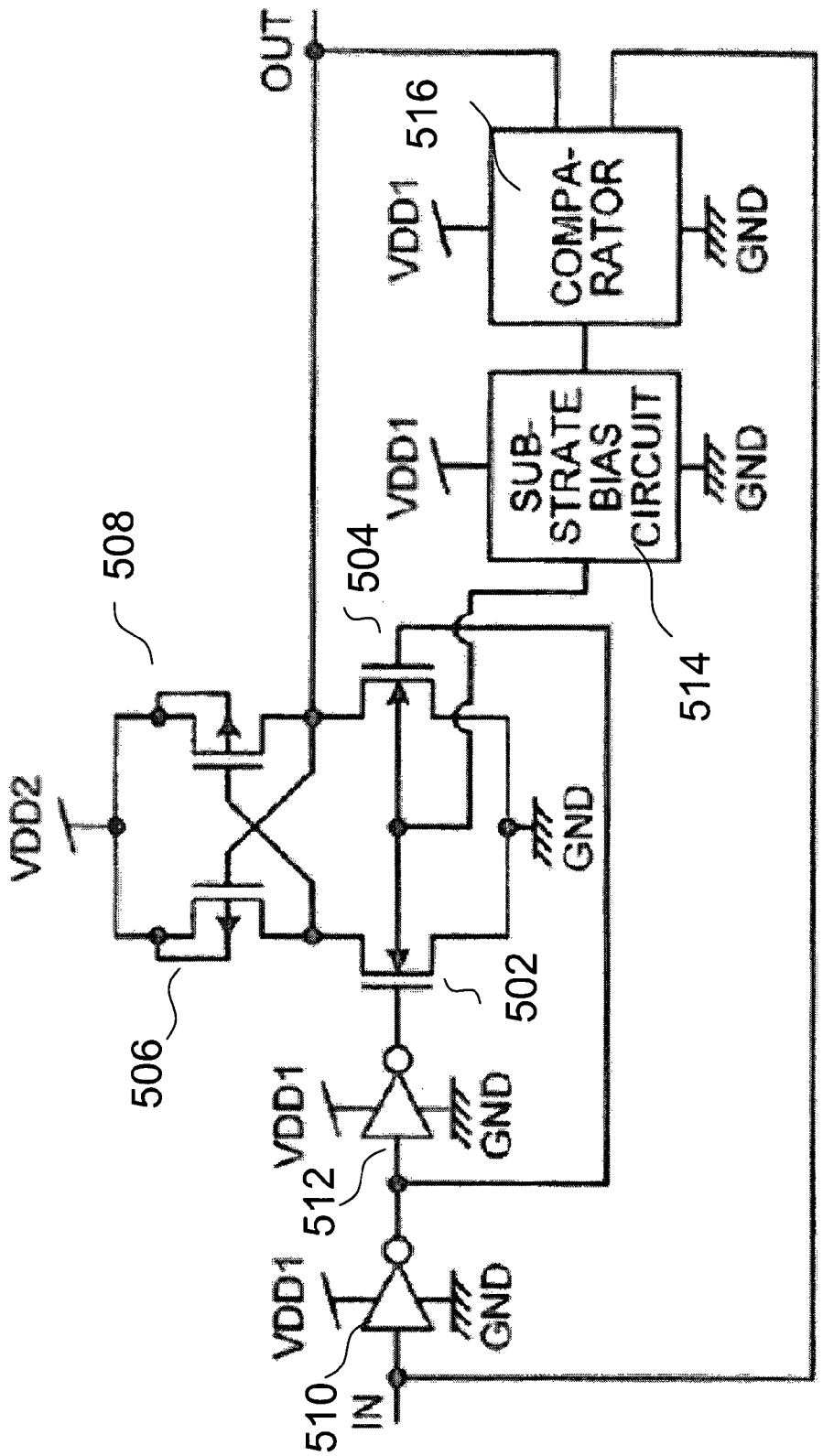
FIG. 5 shows a schematic of a level shifter.

FIG. 5 shows a schematic 500 of a level shifter. The level shifter includes a level shifter stage including NMOS transistors 502, 504 and PMOS transistors 506, 508 arranged in the cross-coupled PMOS configuration. The level shifter further includes input inverters 510, 512. The level shifter further includes a substrate bias circuit 514 and a comparator 516 to apply forward body bias to the pull-down transistors 506, 508 for reducing propagation delays during transitions and apply reverse body-bias to reduce standby leakage out of transitions. However, this requires triple well technology and large area overhead caused by well separation, body bias-control and output detection. In addition, forward body-bias itself consumes leakage power.

The circuit arrangements illustrated in FIGS. 2-5 may be able to shift sub-threshold voltage level to nominal (core) voltage level, but not to the IO voltage level. One of the challenges to shift to the IO level is that components which are able to tolerate IO voltages typically have higher $V_t$ than the nominal voltage components. Using them will degrade the performance of the level shifter. Another challenge is that, compared to shifting to core voltage level, the gap between the input VDD and output VDD is larger, making the level shifting more difficult.

Figure 6:
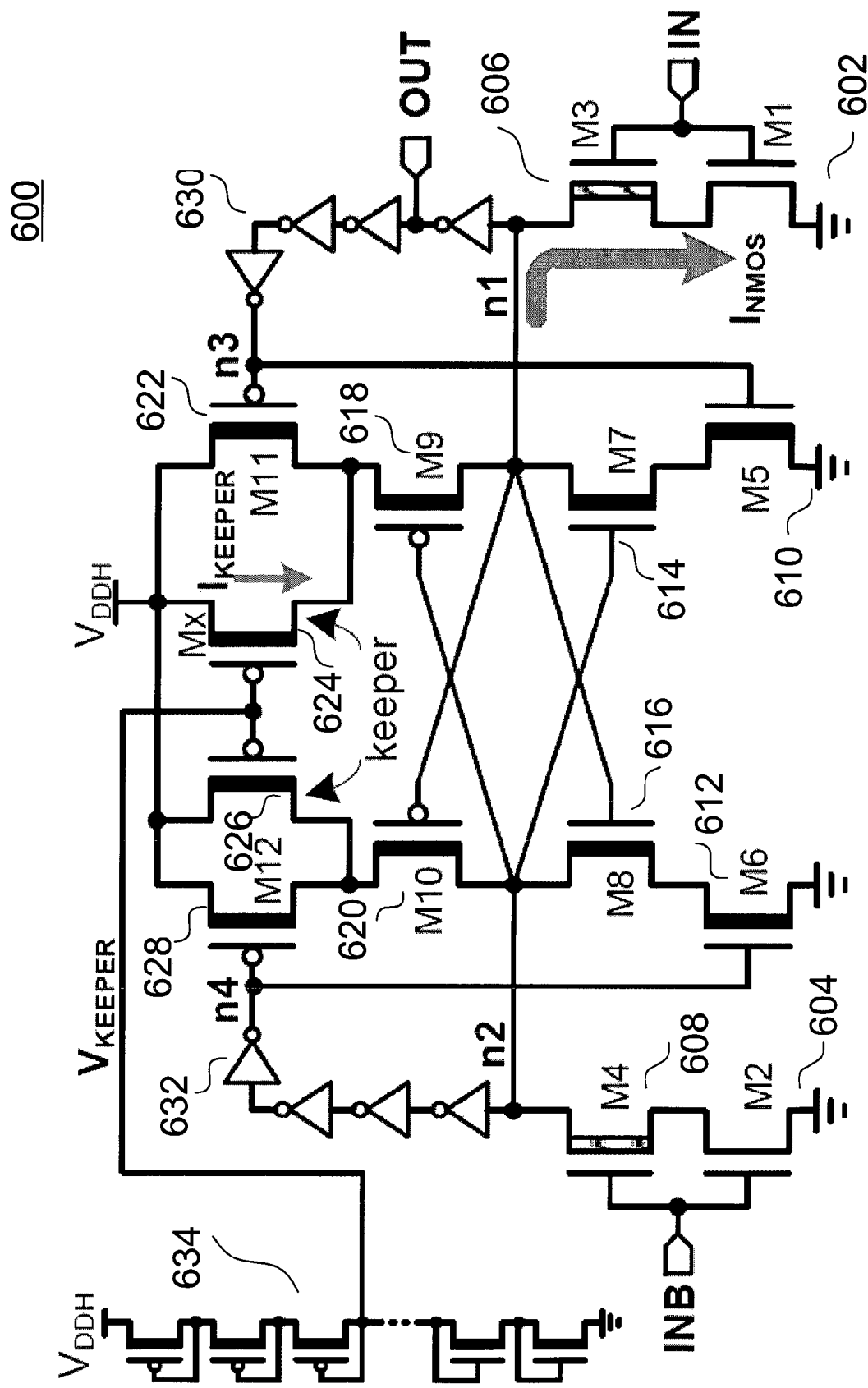
FIG. 6 shows a schematic of a level shifter.

FIG. 6 shows a schematic 600 of a level shifter. The level shifter may includes a level shifting stage including transistors 602, 604, 606, 608, 610, 612, 614, 616, 618, 620, 622, 624, 626, 626, 628, inverters 630, 632 and a biasing circuit 634 including a diode chain. The diode chain includes a plurality of transistors configured as diodes. The level shifter illustrated in FIG. 6 applies a pulse control strategy to avoid contention and uses zero-threshold voltage ($V_t$) components with fast standard threshold voltage ($SV_t$) full-down components to achieve fast level shifting and IO voltage tolerance. As a result, the level shifter is able to shift from sub-threshold up to IO voltage level with small delay and power consumption. However, the level shifter uses more than 30 transistors leading to large area.

Figure 7:
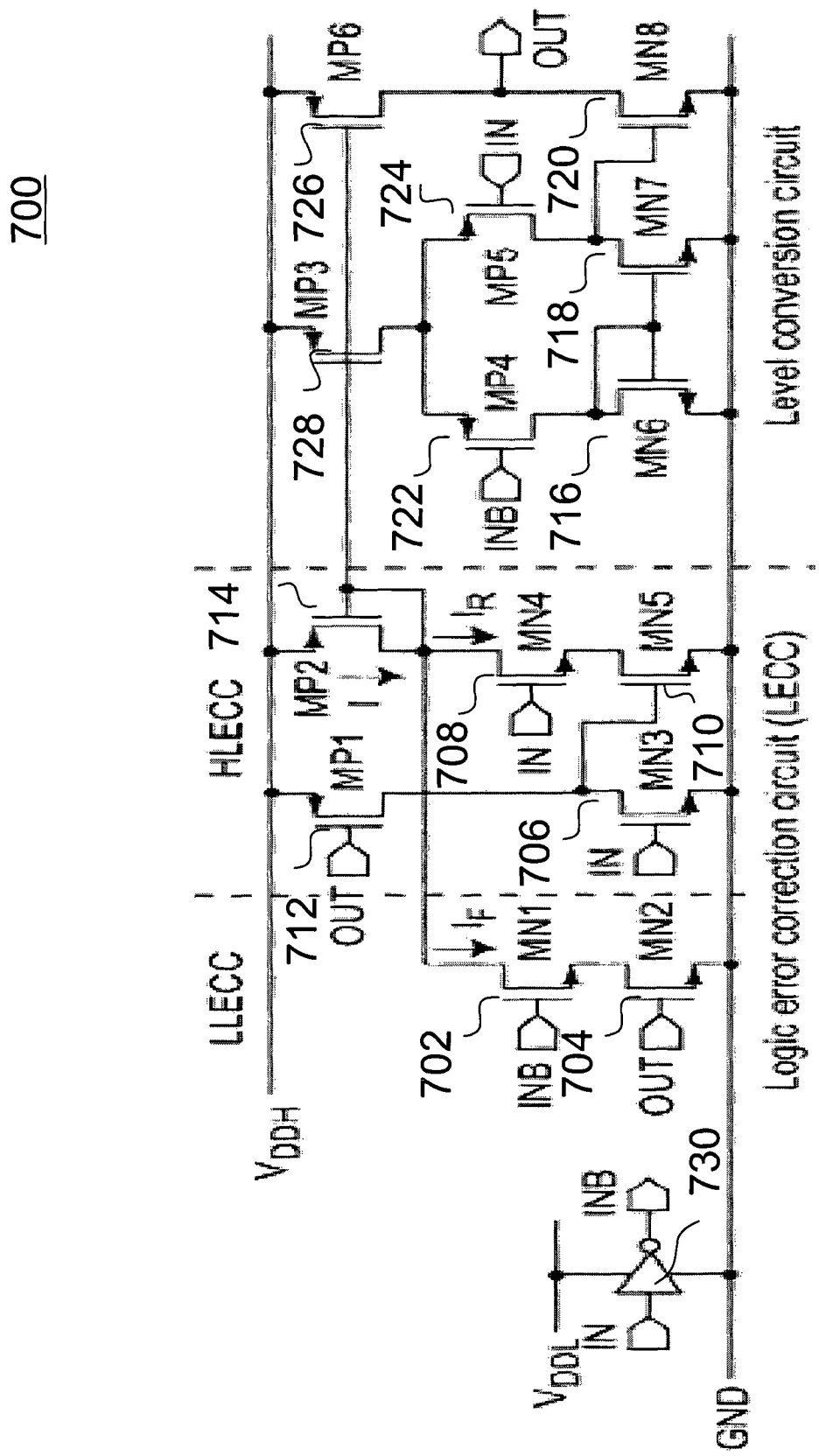
FIG. 7 shows a schematic of a level shifter.

FIG. 7 shows a schematic 700 of a level shifter. The level shifter may include a logic error conversion circuit (LECC) including transistors 702, 704, 706, 708, 710, 712, 714. The level shifter may further include a level conversion circuit including transistors 716, 718, 720, 722, 724, 726, 728. The level shifter may also include an inverter 730 coupled to the LECC and the level conversion circuit. The level shifter combines comparator and current mirror structure to eliminate the static current to reduce the leakage power. The level shifter uses 3.3 V devices so it is able to shift up to IO voltage level. However, the two-stage operation structure causes relatively large delay compared to single-stage. In addition, the dynamic power is increased due to the use of comparator.

Figure 8:
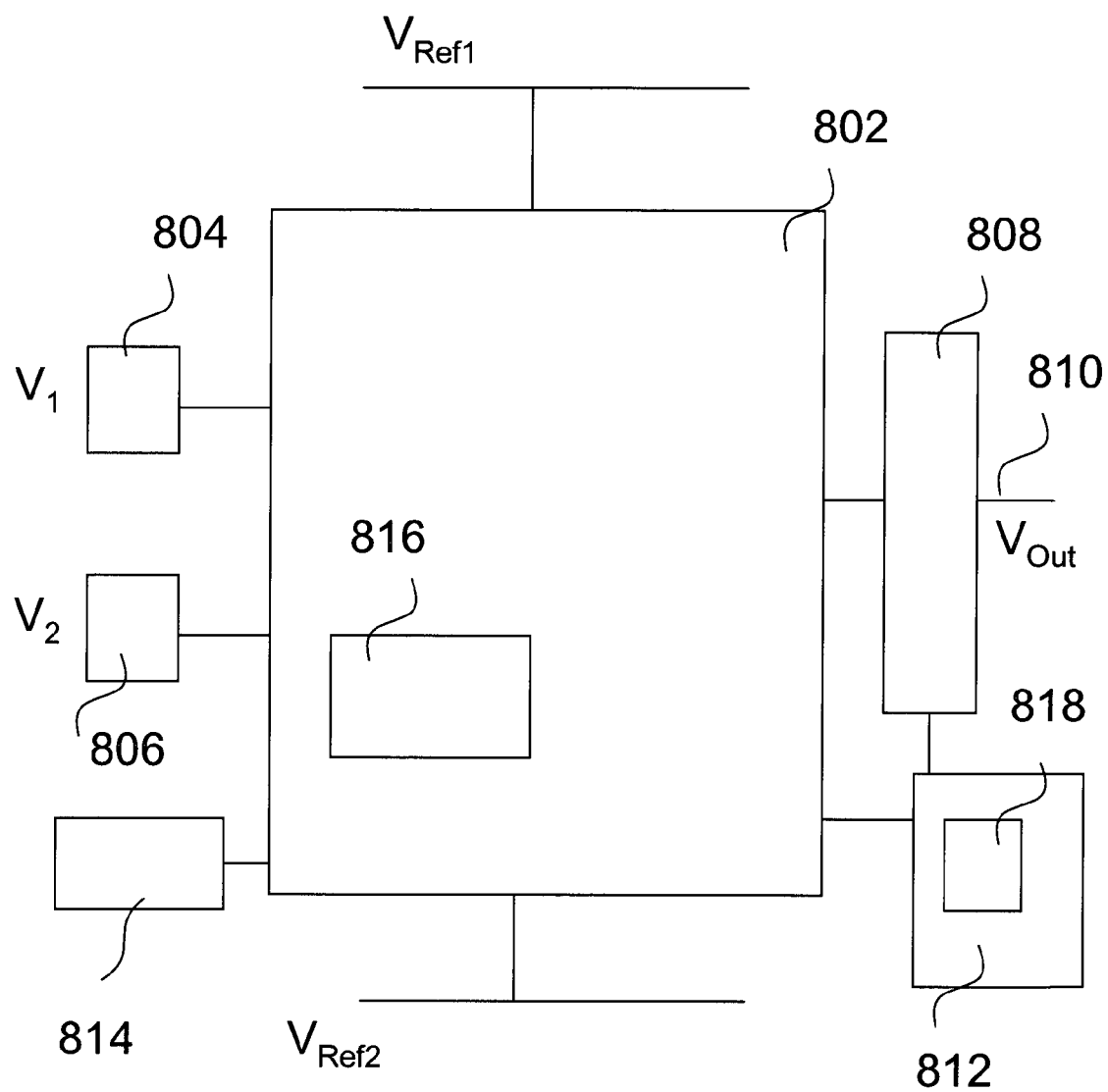
FIG. 8 is a schematic illustrating a circuit arrangement according to various embodiments.

FIG. 8 is a schematic 800 illustrating a circuit arrangement according to various embodiments.

In various embodiments, a circuit arrangement may be provided. The circuit arrangement may include a level shifting stage 802 configured to be coupled to a first reference voltage ($V_{Ref1}$) and a second reference voltage ($V_{Ref2}$). The circuit arrangement may also include a first input electrode 804 in electrical connection with the level shifting stage 802 for coupling a first input voltage ($V_1$). The first input voltage may be configured to switch between a first logic state and a second logic state. The circuit arrangement may further include a second input electrode 806 in electrical connection with the level shifting stage 802 for coupling a second input voltage ($V_2$). The second input voltage may be configured to switch between the first logic state and the second logic state. The circuit arrangement may additionally include an output stage 808 coupled to the level shifting stage 802, the output stage 808 including an output node 810. The level shifting stage 802 may be configured to generate an output voltage ($V_{out}$) above a predetermined output level at the output node 810 due to the first reference voltage when the first input voltage is in the first logic state and the second input voltage is in the second logic state. The level shifting stage 802 may be further configured to generate the output voltage below the predetermined output level at the output node 810 due to the second reference voltage when the first input voltage is in the second logic state and the second input voltage is in the first logic state. The circuit arrangement may also include a feedback circuit 812 coupled to the output stage 808 and the level shifting stage 802. The circuit arrangement may additionally include a voltage stabilization circuit 814 coupled to the level shifting stage 802. The level shifting stage 802 may include a switching mechanism 816 configured to cause an internal current above a predetermined current level to flow through the level shifting stage 802 due to the first reference voltage and the second reference voltage when the switching mechanism 816 is activated. The switching mechanism 816 may be further configured to at least reduce the internal current flowing through the level shifting stage to below the predetermined current level when the switching mechanism 816 is deactivated. The feedback circuit may include a feedback mechanism 818 configured to be deactivated when the output voltage is above the predetermined output level. The feedback mechanism 818 may be further configured to be activated when the output level is below the predetermined output level. The switching mechanism 816 may be configured to be activated when the first input voltage is in the first logic state and when the feedback mechanism is activated. The switching mechanism may be further configured to be deactivated when the first input voltage is in the first logic state and when the feedback mechanism is deactivated. The voltage stabilization circuit 814 may be configured to maintain the output voltage at above the predetermined output level when the internal current flowing through the level shifting stage 802 is reduced.

In other words, the circuit arrangement may include a level shifting stage 802 and an output stage 808 in electrical connection with the level shifting stage. The level shifting stage 802 may be in electrical connection with a first input electrode 804 and a second input electrode 806. The level shifting stage 802 may be configured so that when a first input voltage applied to the first input electrode 804 is at a first logic state and a second input voltage applied to the second input electrode 806 is at a second logic state, an output voltage having a level close to the first reference voltage is generated at an output node 810 of the output stage 808. Conversely, the level shifting stage 802 may be configured so that the output voltage at output node 810 is at a level close to the second reference voltage when the first input voltage is at the second logic state and the second input voltage is at a first logic state. The circuit arrangement may further include a feedback circuit 812 in electrical connection with the output stage 808 and the level shifting stage 802. The circuit arrangement may also include a voltage stabilization circuit 814 in electrical connection with the level shifting stage 802. The level shifting stage 802 may include a switching mechanism 816, the switching mechanism 816 configured when activated to allow an internal current above a predetermined level to flow and when deactivated reduces the internal current to below the predetermined level. The feedback circuit 812 may include a feedback mechanism 818. The feedback mechanism 818 may be further configured to be activated when the output level is below the predetermined output level. The switching mechanism 816 may be configured to be activated when the first input voltage is in the first logic state and when the feedback mechanism 818 is activated. The switching mechanism 816 may be further configured to be deactivated when the first input voltage is in the first logic state and when the feedback mechanism 818 is deactivated. The voltage stabilization circuit 814 may be configured to maintain the output voltage at above the predetermined output level when the internal current flowing through the level shifting stage 802 is reduced.

When a transistor is "deactivated" or "turn off", no current or an insubstantial subthreshold current may flow between the first controlled electrode and the second controlled electrode of the transistor. When a transistor is "activated" or "turned on", a substantial current greater than the subthreshold current may flow between the first controlled electrode and the second controlled electrode.

When a mechanism is "deactivated" or "turned off", no current or an insubstantial current, e.g. a subthreshold current, may flow through a portion. When the mechanism is "activated" or "turned on", a substantial current, e.g. a current greater than the subthreshold current, may flow through the portion.

The first reference voltage may be higher than the second reference voltage. The first reference voltage may be VDD. The second reference voltage may be ground. The output voltage at the output node 810 may be above the predetermined output level due to the first reference voltage may mean that the output voltage is above the predetermined output level as a result of the output node being electrically connected to the first reference voltage due to one or more switches or transistors being activated and/or one or more further switches or further transistors being deactivated. Correspondingly, the output node at the output node 810 may be below the predetermined output level due to the second reference voltage may mean that the output voltage is below the predetermined output level as a result of the output node being electrically connected to the second reference voltage due to one or more switches or transistors being activated and/or one or more further switches or further transistors being deactivated.

The internal current above a predetermined current level flowing through the level shifting stage 802 due to the first reference voltage and the second reference voltage may mean that the potential difference between the first reference voltage and the second reference voltage directly or indirectly generates the internal current having a level above the predetermined current level to flow through the level shifting stage 802. The current may be generated directly due to the potential difference between the first and second reference voltages or indirectly due to voltages at internal nodes, the voltages at the internal nodes caused by the reference voltage. The current may also be generated indirectly due to a voltage at an internal node and one of the first reference voltage and the second reference voltage, the voltage at the internal node caused by the other reference voltage. For instance, is the current is generated due to a voltage at an internal node and a first reference voltage, the voltage at the internal node may be caused by the second reference voltage.

In various embodiments, the first controlled electrode of a transistor may refer to the drain electrode and the second controlled electrode of the transistor may refer to the source electrode. In various alternate embodiments, the first controlled electrode of a transistor may refer to the source electrode and the second controlled electrode of the transistor may refer to the drain electrode. The control electrode of a transistor may refer to a gate electrode.

In various embodiments, a transistor may be a metal oxide semiconductor field effect transistor (MOSFET). However, the transistor may also be another type of transistors such as a bipolar junction transistor (BJT).

In various embodiments, the switching mechanism 816 may be configured when activated to generate the output voltage above the predetermined output level at the output node 810.

The switching mechanism 816 may be activated when the first input voltage is in the first logic state, the second input voltage is in the second logic state, and the feedback mechanism is activated.

The switching mechanism 816 may be deactivated when the first input voltage is in the second logic state and the second input voltage is in the first logic state. The switching mechanism 816 may be deactivated when the first input voltage is in the first logic state and the second input voltage is in the second logic state but the feedback mechanism 818 is deactivated.

The circuit arrangement may further include an input inverter having an input terminal and an output terminal, the input terminal coupled to the first input electrode 804 and the output terminal coupled to the second input electrode 806.

The level shifting stage 802 may include a first pull-up sub-circuit; a second pull-up sub-circuit coupled to the first pull-up sub-circuit; a first pull-down sub-circuit coupled to the first pull-sup sub-circuit; and a second pull-down sub-circuit coupled to the second pull-up sub-circuit.

In various embodiments, the first pull-down sub-circuit may include a first pull-down high-threshold voltage transistor. The first pull-down sub-circuit may also include a first pull-down low-threshold voltage transistor coupled to the first high-threshold voltage transistor. The second pull-down sub-circuit may include a second pull-down high-threshold voltage transistor. The second pull-down sub-circuit may also include a second pull-down low-threshold voltage transistor coupled to the first high-threshold voltage transistor.

The level shifting stage may include mixed threshold voltage (Vt) components to tolerate the IO voltage while maintaining performance. In various embodiments, the first input voltage and the second input voltage may be sub-threshold voltages. For instance, the first input voltage and the second input voltage may be any value in the range of 0.2 to 0.5 V, e.g. 0.3 to 0.4 V. The first reference voltage and/or the second reference voltage may be I/O voltages. For instance, the first reference voltage may be any value in the range of 2 to 4 V, e.g. 2 to 3.3 V, e.g. 3.0 V. The second reference voltage may be at ground (0 V). In various alternate embodiments, the first reference voltage may be at ground and the second reference voltage may be any value in the range of 2 to 4 V, e.g. 2 to 3.3 V, e.g. 3.0 V. The output voltage may thus be a I/O voltage.

In various alternate embodiments, the first reference voltage and/or the second reference voltage may be core voltages. One or both of the first reference voltage and the second reference voltage may be any value in the range of 0.6 V to 2 V, e.g. 0.6 V to 1.8 V, e.g. 1.2 V. The output voltage may be a core voltage. The input voltages, i.e. the first and second input voltages may be sub-threshold voltages. In various embodiments, circuit arrangements configured to shift sub-threshold voltages to core voltages may not require mixed threshold voltage components or transistors The circuit arrangement may include low-threshold voltage transistors.

In various embodiments, the first pull-down high-threshold voltage transistor and/or the second pull-down high threshold voltage transistor may have a threshold voltage of any value in the range of 3 to 3.5 V, e.g. 3.3 V. The first pull-down low-threshold voltage transistor and/or the second pull-down low threshold voltage transistor may have a threshold voltage of any value in the range of 1.5 to 2 V, e.g. 1.8 V.

In various embodiments, the first pull-down high-threshold voltage transistor may include a control electrode, a first controlled electrode and a second controlled electrode. In various embodiments, the first pull-down low-threshold voltage transistor may include a control electrode, a first controlled electrode and a second controlled electrode.

In various embodiments, the second pull-down high-threshold voltage transistor may include a control electrode, a first controlled electrode and a second controlled electrode. In various embodiments, the second pull-down low-threshold voltage transistor may include a control electrode, a first controlled electrode and a second controlled electrode.

The second controlled electrode of the first pull-down high-threshold voltage transistor may be coupled to the first controlled electrode of the first pull-down low-threshold voltage transistor. The second controlled electrode of the second pull-down high-threshold voltage transistor may be coupled to the first controlled electrode of the second pull-down low-threshold voltage transistor. The first input electrode may be coupled to the control electrode of the first pull-down high-threshold voltage transistor and the control electrode of the first pull-down low-threshold voltage transistor. The second input electrode may be coupled to the control electrode of the second pull-down high-threshold voltage transistor and the control electrode of the second pull-down low-threshold voltage transistor.

In various embodiments, the first pull-up sub-circuit may include a first pull-up high-threshold voltage transistor having a control electrode, a first controlled electrode and a second controlled electrode. The second pull-up sub-circuit may include a second pull-up high-threshold voltage transistor having a control electrode, a first controlled electrode and a second controlled electrode. The first pull-up high-threshold voltage transistor and/or the second pull-up high threshold voltage transistor may have a threshold voltage of any value in the range of 3 to 3.5 V, e.g. 3.3 V.

In various embodiments, the pull-up transistors, e.g. the first pull-up high-threshold voltage transistor and the second pull-up high-threshold voltage transistor may be p-channel metal oxide semiconductor (PMOS) transistors. The pull-down transistors, e.g. the first pull-down high-threshold voltage transistor, the second pull-down high-threshold voltage transistor, the first pull-down low-threshold voltage transistor, the second pull-down low-threshold voltage transistor may be n-channel metal oxide semiconductor (NMOS) transistors. In various alternate embodiments, the pull-up transistors may be NMOS transistors and the pull-down transistors may be PMOS transistors.

In various embodiments, the control electrode of the first pull-up high-threshold voltage transistor may be coupled to the control electrode of the second pull-up high-threshold voltage transistor. The first controlled electrode of the first pull-up high-threshold voltage transistor may be coupled to the first controlled electrode of the first pull-down high-threshold voltage transistor. The first controlled electrode of the second pull-up high-threshold voltage transistor may be coupled to the first controlled electrode of the second pull-down high-threshold voltage transistor and the output stage. The second controlled electrode of the first pull-up high-threshold voltage transistor and the second controlled electrode of the second pull-up high-threshold voltage may be configured to be coupled to the first reference voltage.

In various embodiments, the first controlled electrode of the first pull-up high-threshold voltage transistor may be coupled to the control electrode of the first pull-up high-threshold voltage transistor. In various embodiments, the level shifting stage 802 may include a current mirror. In various embodiments, the pull-up transistors and the pull-down transistors may be arranged in the current mirror configuration.

In various embodiments, the feedback circuit 812 may include a feedback transistor having a control electrode, a first controlled electrode and a second controlled electrode. The feedback mechanism 818 may include the feedback transistor. The feedback mechanism 818 may be configured to be activated by activating the feedback transistor.

The first controlled electrode of the feedback transistor may be coupled to the second controlled electrode of the first pull-down low-threshold voltage transistor. The second controlled electrode of the feedback transistor and the second controlled electrode of the second pull-down low-threshold voltage transistor may be configured to be coupled to the second reference voltage. The control electrode of the feedback transistor may be coupled to the output stage.

The switching mechanism 816 may include the first pull-down low-threshold voltage transistor, the first pull-down high-threshold voltage transistor and the feedback transistor. The first pull-down low threshold voltage transistor, the first pull-down high-threshold voltage transistor and the feedback transistor may be sequentially coupled. The first pull-down low-threshold voltage transistor and the first pull-down high-threshold voltage transistor may be configured to be activated to allow the internal current flowing through the first pull-down low-threshold voltage transistor, the first pull-down high-threshold voltage transistor and the feedback transistor to be above the predetermined current level when the first input voltage having a first logic state is applied to the input electrode.

The feedback transistor may be configured to be deactivated to at least reduce the internal current flowing through the first pull-down low-threshold voltage transistor, the first pull-down high-threshold voltage transistor and the feedback transistor to below the predetermined current level when the output voltage is above the predetermined output level.

In various embodiments, the feedback mechanism 818 may be coupled or may overlap or may be part of the switching mechanism 816. The feedback mechanism 818 may be configured to override the switching mechanism 816 or remaining switching mechanism 816 (i.e. the first pull-down low-threshold voltage transistor and the first pull-down high-threshold voltage transistor) to reduce the internal current. Even when the first pull-down low-threshold voltage transistor and the first pull-down high-threshold voltage transistor are activated to allow internal current above the predetermined level to pass through, the deactivation of the feedback transistor may reduce the internal current to below the predetermined level.

The output stage 808 may include a first output inverter having an input terminal and an output terminal. The output stage 808 may further include a second output inverter having an input terminal and an output, terminal. The input terminal of the first output inverter may be coupled to the first controlled electrode of the second pull-up high threshold voltage transistor and the first controlled electrode of the second pull-down high threshold voltage transistor. The output terminal of the first output inverter may be coupled to the input terminal of the second inverter and the control electrode of the feedback transistor. The output terminal of the second output inverter maybe coupled to the output node 810.

The feedback transistor may be configured to be deactivated by a voltage at the output terminal of the first output inverter when the output voltage is above the predetermined output level.

In various embodiments, the voltage stabilization circuit 814 may include a switch transistor having a control electrode, a first controlled electrode and a second controlled electrode. The voltage stabilization circuit 814 may further include a biasing circuit comprising one or more sequentially coupled biasing elements, the biasing circuit having a first end coupled to the switching transistor and a second end coupled to the control electrode of the first pull-up high threshold voltage transistor and the control electrode of the second pull-up high threshold voltage transistor.

The control electrode of the switch transistor may be coupled to the first input electrode. The first controlled electrode of the switch transistor may be coupled to the biasing circuit. The second controlled electrode of the switch transistor may be coupled to the second reference voltage. The switch transistor may be configured to be activated when the first input voltage is in the first logic state.

The one or more sequentially biasing elements may include a biasing transistor at the second end of the biasing circuit. The biasing transistor may include a control electrode, a first controlled electrode and a second controlled electrode. The control electrode of the biasing transistor may be coupled to a first controlled electrode of the biasing transistor. The biasing transistor may be configured as a diode. The control electrode of the biasing transistor may be further coupled to the control electrode of the first pull-up high-threshold voltage transistor and the control electrode of the second pull-up high-threshold voltage transistor.

The biasing transistor may be configured to be at least be partially activated when the reduction of the internal current causes a voltage at the control electrode of the first pull-up high-threshold voltage transistor and the control electrode of the second pull-up high-threshold voltage transistor to fall outside a predetermined range from the second reference voltage, so that the voltage at the control electrode of the first pull-up high-threshold voltage transistor and the control electrode of the second pull-up high-threshold voltage transistor is maintained at a predefined voltage (or predefined range of voltages) or shifted to be within the predetermined range from the second reference voltage. When the internal current is reduced, the voltage at the control electrodes of the pull-up transistors may no longer be within a predetermined ranged from the second reference voltage. The biasing transistor may be configured such that the biasing transistor is at least partially activated to allow a biasing current to flow through and/or to allow the voltage at the control electrodes of the pull-up transistors to be maintained at a predefined voltage or range of voltages. The pull-up transistors may be sufficiently activated to maintain the output voltage at above the predetermined level due to the voltage stabilization circuit 814.

Figure 9:
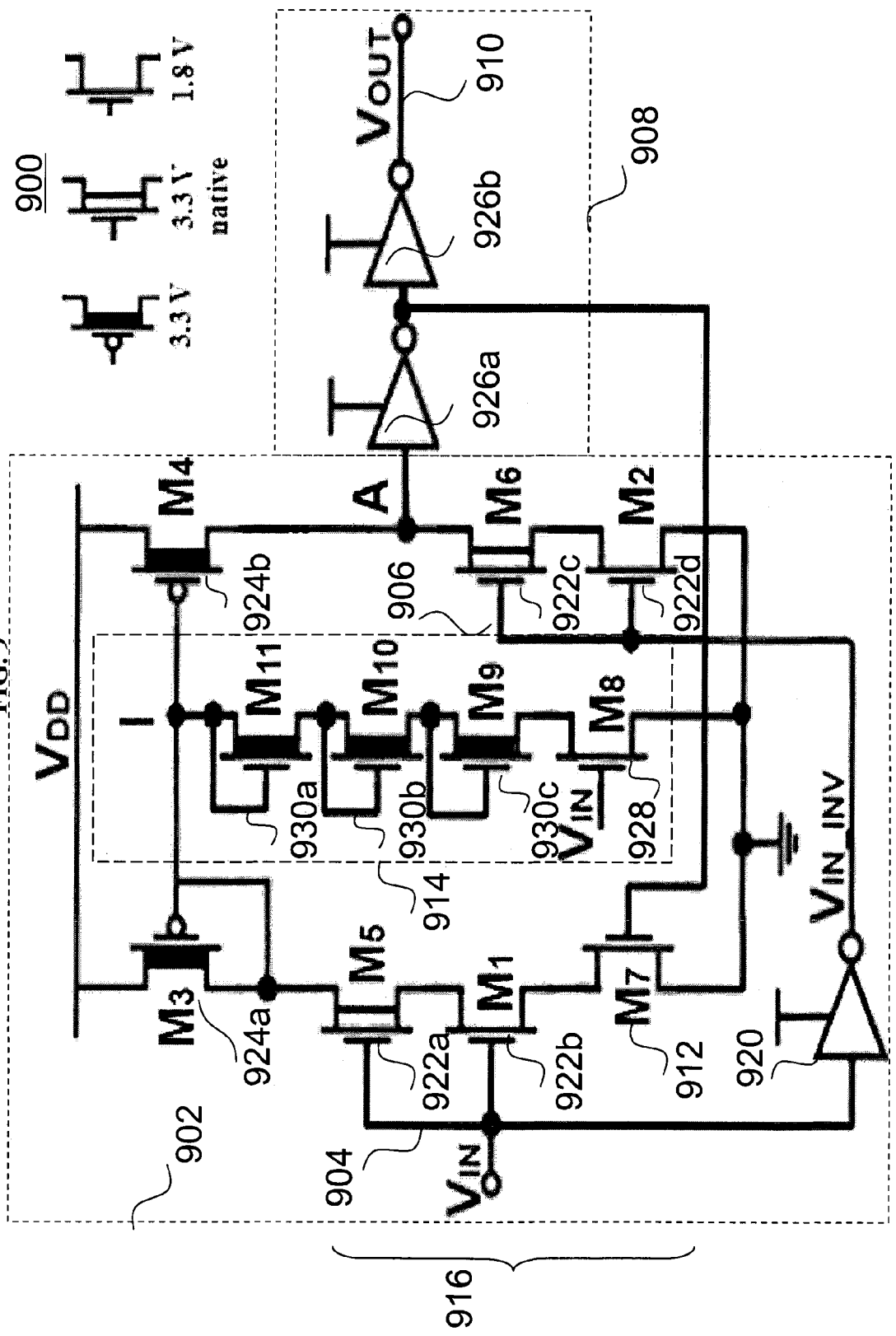
FIG. 9 is a schematic illustrating a circuit arrangement according to various embodiments.

FIG. 9 is a schematic 900 illustrating a circuit arrangement according to various embodiments.

In various embodiments, a circuit arrangement may be provided. The circuit arrangement may include a level shifting stage 902 configured to be coupled to a first reference voltage (indicated in FIG. 9 as VDD) and a second reference voltage (indicated in FIG. 9 as ground). The circuit arrangement may also include a first input electrode 904 in electrical connection with the level shifting stage 902 for coupling a first input voltage ($V_{IN}$). The first input voltage may be configured to switch between a first logic state and a second logic state. The circuit arrangement may further include a second input electrode 906 in electrical connection with the level shifting stage 902 for coupling a second input voltage ($V_{IN\_INV}$). The second input voltage may be configured to switch between the first logic state and the second logic state. The circuit arrangement may additionally include an output stage 908 coupled to the level shifting stage 902, the output stage 908 including an output node 910. The level shifting stage 902 may be configured to generate an output voltage ($V_{OUT}$) above a predetermined output level at the output node 910 due to the first reference voltage when the first input voltage is in the first logic state and the second input voltage is in the second logic state. The level shifting stage 902 may be further configured to generate the output voltage below the predetermined output level at the output node 910 due to the second reference voltage when the first input voltage is in the second logic state and the second input voltage is in the first logic state. The circuit arrangement may also include a feedback circuit 912 coupled to the output stage 908 and the level shifting stage 902. The circuit arrangement may additionally include a voltage stabilization circuit 914 coupled to the level shifting stage 902. The level shifting stage 902 may include a switching mechanism 916 configured to cause an internal current above a predetermined current level to flow through the level shifting stage 902 due to the first reference voltage and the second reference voltage when the switching mechanism 916 is activated. The switching mechanism 916 may be further configured to at least reduce the internal current flowing through the level shifting stage to below the predetermined current level when the switching mechanism 916 is deactivated. The feedback circuit 912 may include a feedback mechanism configured to be deactivated when the output voltage is above the predetermined output level. The feedback mechanism may be further configured to be activated when the output level is below the predetermined output level. The switching mechanism 916 may be configured to be activated when the first input voltage is in the first logic state and when the feedback mechanism is activated. The switching mechanism 916 may be further configured to be deactivated when the first input voltage is in the first logic state and when the feedback mechanism is deactivated. The voltage stabilization circuit 914 may be configured to maintain the output voltage at above the predetermined output level when the internal current flowing through the level shifting stage 902 is reduced.

Various embodiments may provide a fast and energy-efficient level shifter with wide shifting range from sub-threshold to IO voltage levels or core voltage levels.

While the first reference voltage is labeled as VDD and the second reference voltage is labeled as ground in FIG. 9, any suitable voltages may be used as the first and second reference voltages. The first and second reference voltages may be I/O voltages or core voltages. In various alternate embodiments, the second reference voltage may be VDD and the first reference voltage may be ground.

In various embodiments, the level shifting stage 902 may include a current mirror. Advantageously, the circuit arrangement may benefit from short delay and small area. The feedback mechanism (alternatively referred to as a feedback control) may be used to eliminate static current. The voltage stabilization circuit 914 may include an input-controlled diode chain used to prevent output drop as observed in the level shifter illustrated in FIG. 4.

In various embodiments, the circuit arrangement may include an input inverter 920 in electrical connection with the first input electrode 904 and the second input electrode 906. The first input electrode 904 may be in electrical connection with an input terminal of the input inverter 920 and the second input electrode 906 may be in electrical connection with an output terminal of the input inverter 920. The input inverter 920 may be configured to invert the first input voltage to generate the second input voltage so that when the first input voltage is at a first logic state, the second input voltage is at a second logic state different from the first logic state. The first input voltage may have a logic state different from the second input voltage at steady state.

In various embodiments, the switching mechanism 916 may be configured when activated to generate the output voltage above the predetermined output level at the output node 910. The switching mechanism 916 may be configured when deactivated to generate the output voltage below the predetermined output level at the output node 910.

The switching mechanism 916 may be activated when the first input voltage is in the first logic state, the second input voltage is in the second logic state, and the feedback mechanism is activated.

The switching mechanism 916 may be deactivated when the first input voltage is in the second logic state and the second input voltage is in the first logic state. The switching mechanism 916 may be deactivated when the first input voltage is in the first logic state and the second input voltage is in the second logic state but the feedback mechanism is deactivated.

The level shifting stage 902 may include a first pull-up sub-circuit; a second pull-up sub-circuit coupled to the first pull-up sub-circuit; a first pull-down sub-circuit coupled to the first pull-sup sub-circuit; and a second pull-down sub-circuit coupled to the second pull-up sub-circuit.

In various embodiments, the first pull-down sub-circuit may include a first pull-down high-threshold voltage transistor 922a. The first pull-down sub-circuit may also include a first pull-down low-threshold voltage transistor 922b coupled to the first high-threshold voltage transistor 922a. The first pull-down sub-circuit may include a first pull-down high-threshold voltage transistor 922a and a first pull-down low-threshold voltage transistor 922b sequentially coupled to the first pull-down high-threshold voltage transistor 922a.

The second pull-down sub-circuit may include a second pull-down high-threshold voltage transistor 922c. The second pull-down sub-circuit may also include a second pull-down low-threshold voltage transistor 922d coupled to the first high-threshold voltage transistor 922c. The second pull-down sub-circuit may include a second pull-down high-threshold voltage transistor 922c and a second pull-down low-threshold voltage transistor 922d sequentially coupled to the second pull-down high-threshold voltage transistor 922c.

The level shifting stage may include mixed threshold voltage (Vt) components to tolerate the IO voltage while maintaining performance. In various embodiments, the first input voltage and the second input voltage may be sub-threshold voltages. For instance, the first input voltage and the second input voltage may be any value in the range of 0.2 to 0.5 V, e.g. 0.3 to 0.4 V. The first reference voltage and/or the second reference voltage may be I/O voltages. For instance, the first reference voltage may be any value in the range of 2 to 4 V, e.g. 2 to 3.3 V, e.g. 3.0 V. The second reference voltage may be at ground (0 V). In various alternate embodiments, the first reference voltage may be at ground and the second reference voltage may be any value in the range of 2 to 4 V, e.g. 2 to 3.3 V, e.g. 3.0 V. The output voltage may thus be a I/O voltage. Mixed threshold components may refer to the inclusion of transistors or other components have different voltages in the same circuit arrangement. For instance, as shown in FIG. 9, the circuit arrangement may include transistors having different threshold voltages.

In various alternate embodiments, the first reference voltage and/or the second reference voltage may be core voltages. One or both of the first reference voltage and the second reference voltage may be any value in the range of 0.6 V to 2 V, e.g. 0.6 V to 1.8 V, e.g. 1.2 V. The output voltage may be a core voltage. The input voltages, i.e. the first and second input voltages may be sub-threshold voltages. In various embodiments, circuit arrangements configured to shift sub-threshold voltages to core voltages may not require mixed threshold voltage components.

In various embodiments, the first pull-down high-threshold voltage transistor 922a and/or the second pull-down high threshold voltage transistor 922c may have a threshold voltage of any value in the range of 3 to 3.5 V, e.g. 3.3 V. The first pull-down low-threshold voltage transistor 922b and/or the second pull-down low threshold voltage transistor 922d may have a threshold voltage of any value in the range of 1.5 to 2 V, e.g. 1.8 V.

In various embodiments, the first pull-down high-threshold voltage transistor 922a may include a control electrode, a first controlled electrode and a second controlled electrode. In various embodiments, the first pull-down low-threshold voltage transistor 922b may include a control electrode, a first controlled electrode and a second controlled electrode.

In various embodiments, the second pull-down high-threshold voltage transistor 922c may include a control electrode, a first controlled electrode and a second controlled electrode. In various embodiments, the second pull-down low-threshold voltage transistor 922d may include a control electrode, a first controlled electrode and a second controlled electrode.

The second controlled electrode of the first pull-down high-threshold voltage transistor 922a may be coupled to the first controlled electrode of the first pull-down low-threshold voltage transistor 922b. The second controlled electrode of the second pull-down high-threshold voltage transistor 922c may be coupled to the first controlled electrode of the second pull-down low-threshold voltage transistor 922d.

The first input electrode 904 may be coupled to the control electrode of the first pull-down high-threshold voltage transistor 922a and the control electrode of the first pull-down low-threshold voltage transistor 922b. The second input electrode 906 may be coupled to the control electrode of the second pull-down high-threshold voltage transistor 922c and the control electrode of the second pull-down low-threshold voltage transistor 922d.

In various embodiments, the first pull-up sub-circuit may include a first pull-up high-threshold voltage transistor 924a having a control electrode, a first controlled electrode and a second controlled electrode. The second pull-up sub-circuit may include a second pull-up high-threshold voltage transistor 924b having a control electrode, a first controlled electrode and a second controlled electrode. The first pull-up high-threshold voltage transistor 924a and/or the second pull-up high threshold voltage transistor 924b may have a threshold voltage of any value in the range of 3 to 3.5 V, e.g. 3.3 V.

In various embodiments, the positions of the first pull-down high-threshold voltage transistor 922a and the first pull-down low-threshold voltage transistor 922b in FIG. 9 may be interchanged. Similarly, the positions of the second pull-down high-threshold voltage transistor 922c and the second pull-down low-threshold voltage transistor 922d may be interchanged.

Various embodiments may include circuit arrangements configured to shift from sub-threshold voltages to core voltages (may be referred to as core voltage shifting circuit arrangements). In various alternate embodiments, the first pull-up sub-circuit may include a first pull-up low voltage transistor instead of the first pull-up high-threshold voltage transistor 924a. The first pull-up low voltage transistor may also have a having a control electrode, a first controlled electrode and a second controlled electrode. The second pull-up sub-circuit may include a second pull-up low voltage transistor instead of the second pull-up high-threshold voltage transistor 924b. The second pull-up voltage transistor may also have a having a control electrode, a first controlled electrode and a second controlled electrode. The first and second pull-up low voltage transistors may be coupled to other electrical components in a similar manner to the first and second pull-up high voltage transistors. References to the first pull-up high-threshold voltage transistor 924a in the present specification may instead refer to the first pull-up low-threshold transistor and reference to the second pull-up high-threshold voltage transistor 924b may instead refer to the second pull-up low-threshold transistor whenever appropriate. The first and second pull-up low voltage transistors may be used in circuit arrangements configured to shift sub-threshold voltages to core voltages. The first input electrode 904 may be coupled (only) to the control electrode of the first pull-down low-threshold voltage transistor 922b. The second input electrode 906 may be coupled (only) to the control electrode of the second pull-down low-threshold voltage transistor 922d.

In various embodiments, the pull-up transistors, e.g. the first pull-up high-threshold voltage transistor 924a and the second pull-up high-threshold voltage transistor 924b, may be p-channel metal oxide semiconductor (PMOS) transistors. The pull-down transistors, e.g. the first pull-down high-threshold voltage transistor 922a, the second pull-down high-threshold voltage transistor 922c, the first pull-down low-threshold voltage transistor 922b, the second pull-down low-threshold voltage transistor 922d, may be n-channel metal oxide semiconductor (NMOS) transistors. In various alternate embodiments, the pull-up transistors may be NMOS transistors and the pull-down transistors may be PMOS transistors.

In various embodiments, the control electrode of the first pull-up high-threshold voltage transistor 924a may be coupled to the control electrode of the second pull-up high-threshold voltage transistor 924b. The first controlled electrode of the first pull-up high-threshold voltage transistor 924a may be coupled to the first controlled electrode of the first pull-down high-threshold voltage transistor 922a. The first controlled electrode of the second pull-up high-threshold voltage transistor 924b may be coupled to the first controlled electrode of the second pull-down high-threshold voltage transistor 922c and the output stage 908. The second controlled electrode of the first pull-up high-threshold voltage transistor 924a and the second controlled electrode of the second pull-up high-threshold voltage 924b may be configured to be coupled to the first reference voltage, e.g. VDD.

In various alternate embodiments, e.g. in core voltage shifting circuit arrangements, the first controlled electrode of the first pull-up low-threshold voltage transistor may be coupled to the first controlled electrode of the first pull-down low-threshold voltage transistor 922b. The first controlled electrode of the second pull-up low-threshold voltage transistor may be coupled to the first controlled electrode of the second pull-down low-threshold voltage transistor 922d and the output stage 908. The second controlled electrode of the first pull-up low-threshold voltage transistor and the second controlled electrode of the second pull-up low-threshold voltage may be configured to be coupled to the first reference voltage, e.g. VDD.

In various embodiments, the first controlled electrode of the first pull-up high-threshold voltage transistor 924a may be coupled to the control electrode of the first pull-up high-threshold voltage transistor 924a. In various alternate embodiments, e.g. in core voltage shifting circuit arrangements, the first controlled electrode of the first pull-up low-threshold voltage transistor may be coupled to the control electrode of the first pull-up low-threshold voltage transistor. In various embodiments, the level shifting stage 902 may include a current mirror. In various embodiments, the pull-up transistors and the pull-down transistors may be arranged in the current mirror configuration.

In various embodiments, the feedback circuit 912 may include a feedback transistor having a control electrode, a first controlled electrode and a second controlled electrode. The feedback mechanism may include the feedback transistor. The feedback mechanism may be configured to be activated by activating the feedback transistor.

The first controlled electrode of the feedback transistor may be coupled to the second controlled electrode of the first pull-down low-threshold voltage transistor 922b. The second controlled electrode of the feedback transistor and the second controlled electrode of the second pull-down low-threshold voltage transistor 922d may be configured to be coupled to the second reference voltage, e.g. ground. The control electrode of the feedback transistor may be coupled to the output stage 908.

The switching mechanism 916 may include the first pull-down low-threshold voltage transistor 922b, the first pull-down high-threshold voltage transistor 922a and the feedback transistor. The first pull-down low threshold voltage transistor 922b, the first pull-down high-threshold voltage transistor 922a and the feedback transistor may be sequentially coupled. The first pull-down low-threshold voltage transistor 922b and the first pull-down high-threshold voltage transistor 922a may be configured to be activated to allow the internal current flowing through the first pull-down low-threshold voltage transistor 922b, the first pull-down high-threshold voltage transistor 922a and the feedback transistor to be above the predetermined current level when the first input voltage having a first logic state is applied to the input electrode 904. The feedback transistor may also be activated for the internal current to be above the predetermined current level.

In various alternate embodiments, e.g. in core voltage shifting circuit arrangements, the switching mechanism 916 may include the first pull-down low-threshold voltage transistor 922b, and the feedback transistor. The first pull-down low-threshold voltage transistor 922b may be configured to be activated to allow the internal current flowing through the first pull-down low-threshold voltage transistor 922b, and the feedback transistor, to be above the predetermined current level when the first input voltage having a first logic state is applied to the input electrode 904. The feedback transistor may also be activated for the internal current to be above the predetermined current level.

The feedback transistor may be configured to be deactivated to at least reduce the internal current flowing through the first pull-down low-threshold voltage transistor 922b, the first pull-down high-threshold voltage transistor 922a and the feedback transistor to below the predetermined current level when the output voltage (at node 910) is above the predetermined output level. In other words, when the output voltage at node 910 is above the predetermined output level, the feedback transistor may be deactivated and the internal current may be reduced to below the predetermined current level.

In various embodiments, the feedback mechanism may be coupled or may overlap or may be part of the switching mechanism 916. The feedback mechanism may be configured to override the switching mechanism 916 or remaining switching mechanism 916 (i.e. the first pull-down low-threshold voltage transistor 922b and the first pull-down high-threshold voltage transistor 922a) to reduce the internal current. Even when the first pull-down low-threshold voltage transistor and the first pull-down high-threshold voltage transistor are activated to allow internal current above the predetermined level to pass through, the deactivation of the feedback transistor may reduce the internal current to below the predetermined level. In other words, the internal current may be below the predetermined current level even if the first pull-down low-threshold voltage transistor 922b and the first pull-down high-threshold voltage transistor 922a are activated but the feedback transistor is deactivated.

In various alternate embodiments, e.g. in core voltage shifting circuit arrangements, the feedback transistor may be configured to be deactivated to at least reduce the internal current flowing through the first pull-down low-threshold voltage transistor 922b, and the feedback transistor, to below the predetermined current level when the output voltage (at node 910) is above the predetermined output level.

The output stage 908 may include a first output inverter 926a having an input terminal and an output terminal. The output stage 808 may further include a second output inverter 926b having an input terminal and an output terminal. The input terminal of the first output inverter 926a may be coupled to the first controlled electrode of the second pull-up high threshold voltage transistor 924b and the first controlled electrode of the second pull-down high threshold voltage transistor 922c. The output terminal of the first output inverter 926a may be coupled to the input terminal of the second inverter 926b and the control electrode of the feedback transistor. The output terminal of the second output inverter 926b maybe coupled to the output node 910. The first output inverter 926a and the second output inverter 926b may be sequentially coupled.

The feedback transistor may be configured to be deactivated by a voltage at the output terminal of the first output inverter 926a when the output voltage is above the predetermined output level. When the output voltage at output node 910 is above the predetermined level, the voltage at the output terminal of the first output inverter 926a may be low. The low voltage at the output terminal of the first output inverter 926a may deactivate the feedback transistor.

In various embodiments, the voltage stabilization circuit 914 may include a switch transistor 928 having a control electrode, a first controlled electrode and a second controlled electrode. The voltage stabilization circuit 914 may further include a biasing circuit comprising one or more sequentially coupled biasing elements (e.g. biasing elements 930a, 930b, 930c), the biasing circuit having a first end coupled to the switching transistor 928 and a second end coupled to the control electrode of the first pull-up high threshold voltage transistor 924a and the control electrode of the second pull-up high threshold voltage transistor 924b.

In various alternate embodiments, e.g. in core voltage shifting circuit arrangements, the biasing circuit may have a first end coupled to the switching transistor 928 and a second end coupled to the control electrode of the first pull-up low threshold voltage transistor and the control electrode of the second pull-up low threshold voltage transistor.

The control electrode of the switch transistor 928 may be coupled to the first input electrode 904. The first controlled electrode of the switch transistor 928 may be coupled to the biasing circuit. The second controlled electrode of the switch transistor 928 may be coupled to the second reference voltage. The switch transistor 928 may be configured to be activated when the first input voltage is in the first logic state.

The one or more sequentially biasing elements, e.g. 930a, 930b, 930c, may be biasing transistors. The one or more sequentially biasing elements may include a biasing transistor 930a at the second end of the biasing circuit. The biasing transistor 930a may include a control electrode, a first controlled electrode and a second controlled electrode. The control electrode of the biasing transistor 930a may be coupled to a first controlled electrode of the biasing transistor 930a. The control electrode of the biasing transistor 930a (and the first controlled electrode of the biasing transistor 930a) may be further coupled to the control electrode of the first pull-up high-threshold voltage transistor 924a and the control electrode of the second pull-up high-threshold voltage transistor 924b.

In various alternate embodiments, e.g. in core voltage shifting circuit arrangements, the control electrode of the biasing transistor 930a (and the first controlled electrode of the biasing transistor 930a) may be further coupled to the control electrode of the first pull-up low-threshold voltage transistor and the control electrode of the second pull-up low-threshold voltage transistor.

The biasing transistor 930*a* may be configured to be at least be partially activated when the reduction of the internal current causes a voltage at the control electrode of the first pull-up high-threshold voltage transistor 924*a* and the control electrode of the second pull-up high-threshold transistor 924*b* (or a voltage at the control electrode of the first pull-up low-threshold voltage transistor and the control gate of the second pull-up low-threshold transistor) to fall outside a predetermined range from the second reference voltage, so that the voltage at the control electrode of the first pull-up high-threshold voltage transistor 924*a* and the control electrode of the second pull-up high-threshold voltage transistor 924*b* is maintained at a predefined voltage or shifted to be within the predetermined range from the second reference voltage.

The one or more sequentially biasing elements may include a further biasing transistor 930*c* at the second end of the biasing circuit. The further biasing transistor 930*c* may include a control electrode, a first controlled electrode and a second controlled electrode. The control electrode of the further biasing transistor 930*c* may be coupled to a first controlled electrode of the further biasing transistor 930*c*. The second controlled electrode of the further biasing transistor 930*c* may be further coupled to switch transistor 928, i.e. the first controlled electrode of switch transistor 928.

The one or more sequentially biasing elements may include one or more intervening biasing transistors 930*b* between the biasing transistor 930*a* and the further biasing transistor 930*c*. For instance, intervening biasing transistor 930*b* may include a control electrode, a first controlled electrode and a second controlled electrode. The control electrode of the intervening biasing transistor 930*b* may be coupled to a first controlled electrode of the intervening biasing transistor 930*b*. The first controlled electrode of the intervening biasing transistor 930*b* may be coupled to the second controlled electrode of the biasing transistor 930*a* and the second controlled electrode of the intervening biasing transistor 930*b* may be coupled to the first controlled electrode of the further biasing transistor 930*c*. Biasing transistor 930*a*, 930*b*, 930*c* may be configured as diodes may coupling the control electrode of each transistor to the first controlled electrode.

When the internal current is reduced, the voltage at the control electrode of the first pull-up high-threshold voltage transistor 924*a* and the control electrode of the second pull-up high-threshold voltage transistor 924*b* may fall outside a predetermined range from the reference voltage, e.g. 0 V. The first pull-up high-threshold voltage transistor 924*a* and the second pull-up high-threshold voltage transistor 924*b* may be partially deactivated or deactivated, thus causing the output voltage to fall, e.g. below the predetermined level. The voltage stabilization circuit 914 may be configured to maintain the output voltage above the predetermined level by shifting the voltage at the control electrode of the first pull-up high-threshold voltage transistor 924*a* and the control electrode of the second pull-up high-threshold voltage transistor 924*b* to be at the predefined voltage or within the predetermined range from the second reference voltage and activating the first pull-up high-threshold voltage transistor 924*a* and the second pull-up high-threshold voltage transistor 924*b*. The switching transistor 928 may be activated when the first input voltage is at the first logic state. When the first input voltage is at the first logic state, the output voltage at the output node 910 may be above the predetermined level. The feedback circuit 912 may be deactivated, causing the internal current to fall below the predetermined current level and the voltage at the control electrode of the first pull-up high-threshold voltage transistor 924*a* and the control electrode of the second pull-up high-threshold voltage transistor 924*b* to fall outside a predetermined range from the second reference voltage. As the voltage at the control electrode of the first pull-up high-threshold voltage transistor 924*a* and the control electrode of the second pull-up high-threshold voltage transistor 924*b* falls outside a predetermined range from the reference voltage, the biasing transistors 930*a*, 930*b*, 930*c* may be activated. A biasing current may flow through the voltage stabilization circuit 914 and the voltage at the control electrode of the first pull-up high-threshold voltage transistor 924*a* and the control electrode of the second pull-up high-threshold voltage transistor 924*b* may be maintained at a predefined voltage or be shifted within the predetermined range from the second reference voltage. The first pull-up high-threshold voltage transistor 924*a* and second pull-up high-threshold voltage transistor 924*b* may be activated or may be activated sufficiently such that the output voltage is above the predetermined output level.

Various embodiments including the feedback transistor may reduce or solve the charge sharing problem. The feedback transistor 912 (e.g. a NMOS transistor) may be arranged between the second reference voltage and the input transistor (e.g. transistor 922*b*). As a result, the delay and power consumption may be improved. For 0→1 transition, the input transistor may be turned on or be activated, generating a mirror current above a predetermined current level through transistor 924*b*. After the internal output node A is charged to high, the inverted output at the output terminal of inverter 926*a* may be feedback to deactivate the feedback transistor 912, which may reduce or eliminate the static current as well as reduce the standby power consumption. However, this may lead to a significant reduction in the current through transistor 924*b* and cause a drop at internal node A (as well as the output voltage at node 910). An input-controlled diode chain (which may also be referred to as voltage stabilization circuit 914) may be used to keep the voltage at node I sufficiently low for maintaining the output voltage above the predetermined level or full VDD. The voltage at node I may be controlled by the threshold voltage of the diode-connected NMOS transistor 928 and the number of stacked NMOS transistors 930*a*, 930*b*, 930*c*. Compared to directly pulling node I to ground, the inclusion of the stacked transistors 930*a*, 930*b*, 930*c* may consume less energy and may make it easier for the subsequent 1→0 transition which leads to further reduction in delay and reduction in energy consumption. Due to the diode and stacking effects, the leakage through the diode chain may be extremely low and the resultant standby current may be negligible. For 1→0 transition, the feedback transistor 912 may be activated or turned on but transistor 922*b* is deactivated or turned off so there is no charge sharing between node I and other nodes. Therefore, both delay and power consumption may be reduced compared to the level shifter shown in FIG. 4.

Various embodiments shown in FIG. 9 have been simulated using a 0.18 µm CMOS process technology where the threshold is around 0.46V. For comparison, the level shifter shown in FIG. 4 is also implemented using the same process technology and optimized for performance and power through repetitive sizing and simulation. In the simulation setup. In the simulation setup, the input of the level shifters is generated using a minimum size buffer to acquire the real slope for the corresponding input VDD. The output is connected to a 100 fF capacitor.

Figure 10:
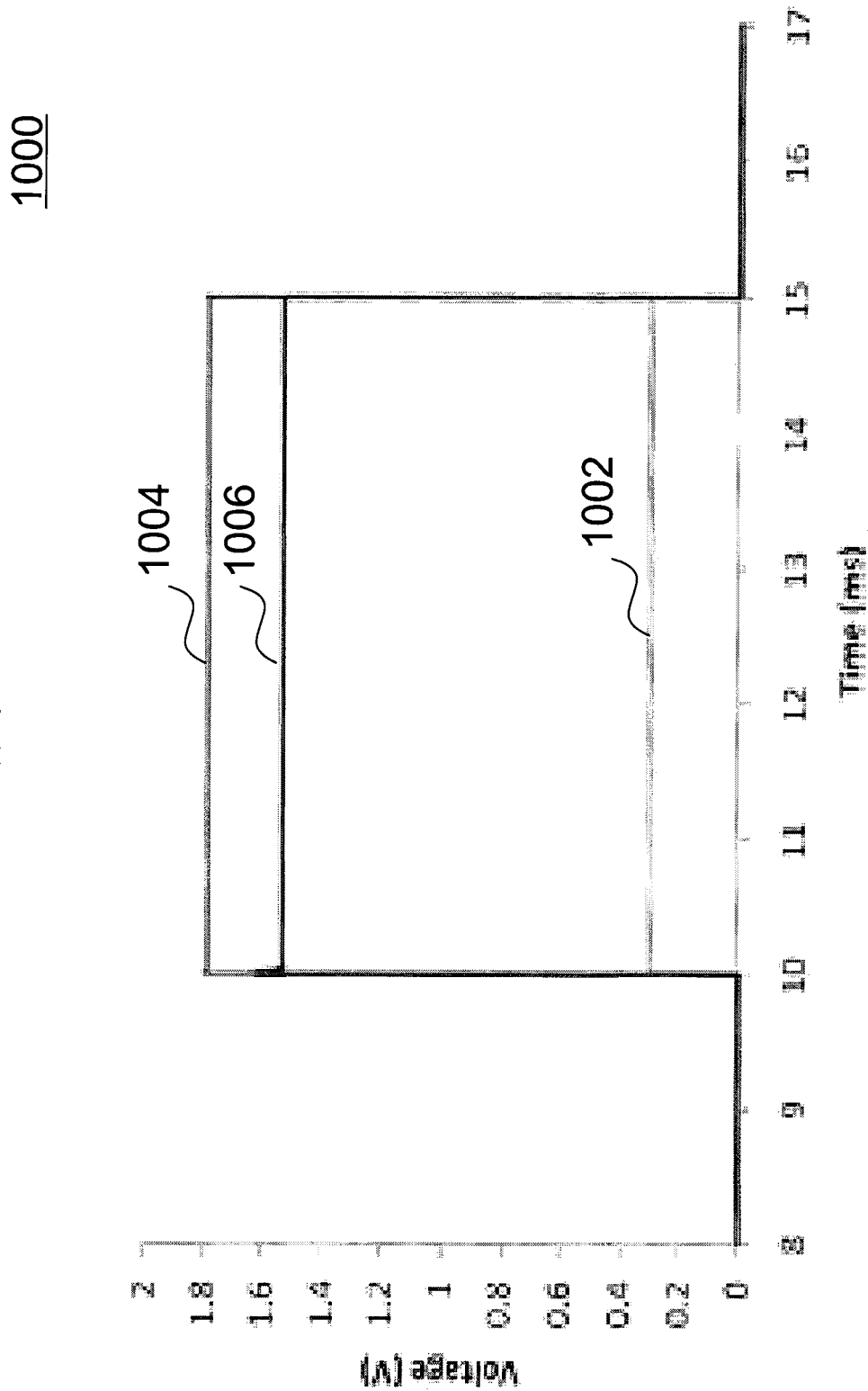
FIG. 10 is a graph showing the transient behaviour of the circuit arrangement illustrated in FIG. 9 according to various embodiments and the level shifter illustrated in FIG. 4.

FIG. 10 is a graph 1000 showing the transient behaviour of the circuit arrangement illustrated in FIG. 9 according to various embodiments and the level shifter illustrated in FIG. 4. 1002 shows the variation of the input voltages to both the circuit arrangement shown in FIG. 9 and the level shifter illustrated in FIG. 4. 1004 shows the output voltage of the circuit arrangement shown in FIG. 9. 1006 shows the output voltage of the level shifter shown in FIG. 4. Both level shifters are able to shift the sub-threshold voltage level (VDDL=0.3 V) to core voltage level (VDD=1.8V). However, the level shifter illustrated in FIG. 4 does not reach full VDD (1.8 V) due to disabled source current path as discussed earlier. The circuit arrangement shown in FIG. 9 may be able to address this through the input-controlled diode chain. By keeping node A at an intermediate voltage between the first reference voltage (VDD) and the second reference voltage (ground), the circuit arrangement may be able to maintain the output at full VDD without increasing delay and energy consumption for the next transition.

Figure 11:
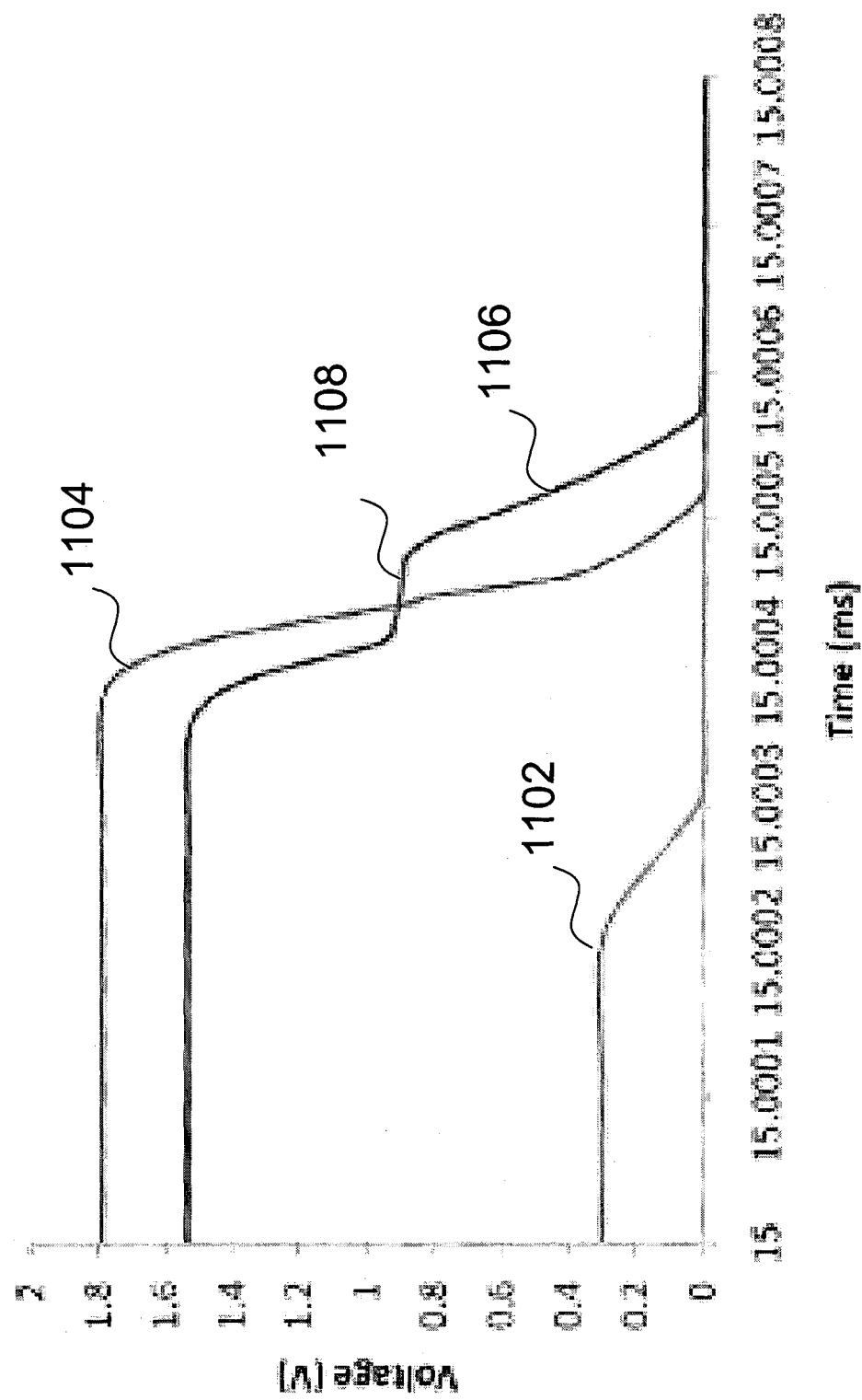
FIG. 11 is a graph showing the fall transition of the circuit arrangement illustrated in FIG. 9 according to various embodiments and the level shifter illustrated in FIG. 4 at the internal output nodes.

FIG. 11 is a graph 1100 showing the fall transition of the circuit arrangement illustrated in FIG. 9 according to various embodiments and the level shifter illustrated in FIG. 4 at the internal output nodes. 1102 shows the variation of the input voltages to both the circuit arrangement shown in FIG. 9 and the level shifter illustrated in FIG. 4. 1104 shows the variation of the voltage at internal node A of the circuit arrangement shown in FIG. 9. 1106 shows the voltage at internal output node of the level shifter shown in FIG. 4. The voltage of the level shifter shown in FIG. 4 exhibits a flat band 1108 in the middle of the fall transition due to the charge sharing problem discussed above. This may cause both increased delay and energy consumption. In the circuit arrangement shown in FIG. 9, this problem may be addressed or solved by using NMOS-based feedback transistor 912 and placing the feedback transistor 912 between input transistor 922b and the second reference voltage (ground). As a result, the charge sharing may be reduced or eliminated and the fall transition may become faster and more energy efficient.

FIG. 12 is a table 1200 showing simulation results of the delay and energy comparison of the circuit arrangement illustrated in FIG. 9 according to various embodiments and the level shifter illustrated in FIG. 4 at different VDD. The input voltage (VDDL) may be fixed at 0.3 V and the first reference voltage (VDD) may be varied from 0.6 V to 3.3 V. Both level shifters may operate for VDDL=0.2 V, but VDDL=0.3 V is selected because it is interesting for most applications with required clock frequencies from kHz to MHz range. Column 1202 shows the input voltages, column 1204 shows the characteristics of the level shifter shown in FIG. 4 while column 1206 shows the characteristics of the circuit arrangement illustrated in FIG. 9. As shown in table 1200, the circuit arrangement illustrated in FIG. 9 has better delay and energy consumption compared to the level shifter shown in FIG. 4. The improvements in delay, active energy and leakage power are up to 4×, 3× and 18× respectively. In addition, the level shifter shown in FIG. 4 may fail to work for VDD above 1.8 V while the circuit arrangement shown in FIG. 9 is able to operate up to 3.3 V. At 3.3 V, the delay of the circuit arrangement shown in FIG. 9 is 164 ns, and the active energy per transition and the leakage power are 891 fJ and 842 pW respectively.

FIG. 13 is a table 1300 comparing simulation results of the circuit arrangement illustrated in FIG. 9 according to various embodiments with the level shifters shown in FIGS. 3, 4, 6 and 7. It is noted that the compared level shifters are implemented using different technologies, so their delay are represented using FO4 delay which represents the typical delay of the used technology at input voltages (input VDD) rather than absolute delay values. This method is also used for the level shifter shown in FIG. 6 for delay comparison. As shown in table 1300, the circuit arrangement shown in FIG. 9 has the smallest delay, active energy and leakage power among the various level shifters. It also shows small delay variability under PVT variations.

FIG. 14 shows a schematic 1400 illustrating a method of operating a circuit arrangement. The method may include in 1402, coupling a level shifting stage to a first reference voltage and a second reference voltage. The method may also include, in 1404, coupling a first input voltage to a first input electrode in electrical connection with the level shifting stage. The first input voltage may be configured to switch between a first logic state and a second logic state. The method may further include, in 1406, coupling a second input voltage to a second input electrode in electrical connection with the level shifting stage. The second input voltage may be configured to switch between the first logic state and the second logic state. The level shifting stage may be coupled to an output stage. The output stage may include an output node. The level shifting stage may be configured to generate an output voltage above a predetermined output level at the output node due to the first reference voltage when the first input voltage is in the first logic state and the second input voltage is in the second logic state. The level shifting stage may be further configured to generate the output voltage below the predetermined output level at the output node due to the second reference voltage when the first input voltage is in the second logic state and the second input voltage is in the first logic state. A feedback circuit may be coupled to the output stage and the level shifting stage. A voltage stabilization circuit may be coupled to the level shifting stage. The level shifting stage may include a switching mechanism configured to cause an internal current above a predetermined current level to flow through the level shifting stage due to the first reference voltage and the second reference voltage when the switching mechanism is activated. The switching mechanism may be further configured to at least reduce the internal current flowing through the level shifting stage to below the predetermined current level when the switching mechanism is deactivated. The feedback circuit may include a feedback mechanism configured to be deactivated when the output voltage is above the predetermined output level and the feedback mechanism is further configured to be activated when the output level is below the predetermined output level. The switching mechanism may be configured to be activated when the first input voltage is in the first logic state and when the feedback mechanism is activated. The switching mechanism may be further configured to be deactivated when the first input voltage is in the first logic state and when the feedback mechanism is deactivated. The voltage stabilization circuit may be configured to maintain the output voltage at above the predetermined output level when the internal current flowing through the level shifting stage is reduced.

Various embodiments include a fast and energy-efficient level shifter with shifting range from sub-threshold to IO voltage level. Various embodiments may solve the standby current and charge sharing problems in conventional current-mirror based level shifters by using a novel feedback mechanism with input-controlled diode chain. Simulations at 0.18 im shows that various embodiments may show significantly better delay and power consumption than state-of-the-art level shifters with similar or less area. For instance, compared with the current-mirror based level shifter shown in FIG. 4, the improvements in delay, active energy, and leakage may be up to 4×, 3×, 18× respectively. Various embodiments may be suitable for low power analog or digital systems where multiple voltage domains exist.

Methods described herein may further contain analogous features of any device or circuit arrangement described herein. Correspondingly, devices or circuit arrangement described herein may further contain analogous features of any methods described herein.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A circuit arrangement comprising:
a level shifting stage configured to be coupled to a first reference voltage and a second reference voltage;
a first input electrode in electrical connection with the level shifting stage for coupling a first input voltage, the first input voltage configured to switch between a first logic state and a second logic state;
a second input electrode in electrical connection with the level shifting stage for coupling a second input voltage, the second input voltage configured to switch between the first logic state and the second logic state;
an output stage coupled to the level shifting stage, the output stage comprising an output node, the level shifting stage configured to generate an output voltage above a predetermined output level at the output node due to the first reference voltage when the first input voltage is in the first logic state and the second input voltage is in the second logic state; and wherein the level shifting stage is further configured to generate the output voltage below the predetermined output level at the output node due to the second reference voltage when the first input voltage is in the second logic state and the second input voltage is in the first logic state;
a feedback circuit coupled to the output stage and the level shifting stage; and
a voltage stabilization circuit coupled to the level shifting stage;
wherein the level shifting stage comprises a switching mechanism configured to cause an internal current above a predetermined current level to flow through the level shifting stage due to the first reference voltage and the second reference voltage when the switching mechanism is activated, the switching mechanism further configured to at least reduce the internal current flowing through the level shifting stage to below the predetermined current level when the switching mechanism is deactivated;
wherein the feedback circuit comprises a feedback mechanism configured to be deactivated when the output voltage is above the predetermined output level, and the feedback mechanism is further configured to be activated when the output level is below the predetermined output level;
wherein the switching mechanism is configured to be activated when the first input voltage is in the first logic state and when the feedback mechanism is activated; and wherein the switching mechanism is further configured to be deactivated when the first input voltage is in the first logic state and when the feedback mechanism is deactivated; and
wherein the voltage stabilization circuit is configured to maintain the output voltage at above the predetermined output level when the internal current flowing through the level shifting stage is reduced.

2. The circuit arrangement according to claim 1, wherein the switching mechanism is configured when activated to generate the output voltage above the predetermined output level at the output node.

3. The circuit arrangement according to claim 1, further comprising an input inverter having an input terminal and an output terminal, the input terminal coupled to the first input electrode and the output terminal coupled to the second input electrode.

4. The circuit arrangement according to claim 1, wherein the level shifting stage comprises
a first pull-up sub-circuit;
a second pull-up sub-circuit coupled to the first pull-up sub-circuit;
a first pull-down sub-circuit coupled to the first pull-sup sub-circuit; and
a second pull-down sub-circuit coupled to the second pull-up sub-circuit.

5. The circuit arrangement according to claim 4;
wherein the first pull-down sub-circuit comprises:
a first pull-down high-threshold voltage transistor; and
a first pull-down low-threshold voltage transistor coupled to the first high-threshold voltage transistor; and
wherein the second pull-down sub-circuit comprises:
a second pull-down high-threshold voltage transistor; and
a second pull-down low-threshold voltage transistor coupled to the first high-threshold voltage transistor.

6. The circuit arrangement according to claim 5,
wherein the first pull-down high-threshold voltage transistor has a control electrode, a first controlled electrode and a second controlled electrode;
wherein the first pull-down low-threshold voltage transistor has a control electrode, a first controlled electrode and a second controlled electrode;
wherein the second pull-down high-threshold voltage transistor has a control electrode, a first controlled electrode and a second controlled electrode;
wherein the second pull-down low-threshold voltage transistor has a control electrode, a first controlled electrode and a second controlled electrode;
wherein the second controlled electrode of the first pull-down high-threshold voltage transistor is coupled to the first controlled electrode of the first pull-down low-threshold voltage transistor; and
wherein the second controlled electrode of the second pull-down high-threshold voltage transistor is coupled to the first controlled electrode of the second pull-down low-threshold voltage transistor;
wherein the first input electrode is coupled to the control electrode of the first pull-down high-threshold voltage transistor and the control electrode of the first pull-down low-threshold voltage transistor; and
wherein the second input electrode is coupled to the control electrode of the second pull-down high-threshold voltage transistor and the control electrode of the second pull-down low-threshold voltage transistor.

7. The circuit arrangement according to claim 6,
wherein the first pull-up sub-circuit comprises:
a first pull-up high-threshold voltage transistor having a control electrode, a first controlled electrode and a second controlled electrode; and wherein the second pull-up sub-circuit comprises:
a second pull-up high-threshold voltage transistor having a control electrode, a first controlled electrode and a second controlled electrode.

8. The circuit arrangement according to claim 7,
wherein the control electrode of the first pull-up high-threshold voltage transistor is coupled to the control electrode of the second pull-up high-threshold voltage transistor;
wherein the first controlled electrode of the first pull-up high-threshold voltage transistor is coupled to the first controlled electrode of the first pull-down high-threshold voltage transistor;
wherein the first controlled electrode of the second pull-up high-threshold voltage transistor is coupled to the first controlled electrode of the second pull-down high-threshold voltage transistor and the output stage;
wherein the second controlled electrode of the first pull-up high-threshold voltage transistor and the second controlled electrode of the second pull-up high-threshold voltage are configured to be coupled to the first reference voltage.

9. The circuit arrangement according to claim 8,
wherein the first controlled electrode of the first pull-up high-threshold voltage transistor is coupled to the control electrode of the first pull-up high-threshold voltage transistor.

10. The circuit arrangement according to claim 9,
wherein the feedback circuit comprises a feedback transistor having a control electrode, a first controlled electrode and a second controlled electrode; and
wherein the feedback mechanism is configured to be activated by activating the feedback transistor.

11. The circuit arrangement according to claim 10,
wherein the first controlled electrode of the feedback transistor is coupled to the second controlled electrode of the first pull-down low-threshold voltage transistor; and
wherein the second controlled electrode of the feedback transistor and the second controlled electrode of the second pull-down low-threshold voltage transistor are configured to be coupled to the second reference voltage; and
wherein the control electrode of the feedback transistor is coupled to the output stage.

12. The circuit arrangement according to claim 11,
wherein the switching mechanism comprises the first pull-down low-threshold voltage transistor, the first pull-down high-threshold voltage transistor and the feedback transistor;
wherein the first pull-down low-threshold voltage transistor and the first pull-down high-threshold voltage transistor are configured to be activated to allow the internal current flowing through the first pull-down low-threshold voltage transistor, the first pull-down high-threshold voltage transistor and the feedback transistor to be above the predetermined current level when the first input voltage having a first logic state is applied to the input electrode; and
wherein the feedback transistor is configured to be deactivated to at least reduce the internal current flowing through the first pull-down low-threshold voltage transistor, the first pull-down high-threshold voltage transistor and the feedback transistor to below the predetermined current level when the output voltage is above the predetermined output level.

13. The circuit arrangement according to claim 12,
wherein the output stage comprises
a first output inverter having an input terminal and an output terminal; and
a second output inverter having an input terminal and an output terminal;
wherein the input terminal of the first output inverter is coupled to the first controlled electrode of the second pull-up high threshold voltage transistor and the first controlled electrode of the second pull-down high threshold voltage transistor;
wherein the output terminal of the first output inverter is coupled to the input terminal of the second inverter and the control electrode of the feedback transistor; and
wherein the output terminal of the second output inverter is coupled to the output node.

14. The circuit arrangement according to claim 13,
wherein the feedback transistor is configured to be deactivated by a voltage at the output terminal of the first output inverter when the output voltage is above the predetermined output level.

15. The circuit arrangement according to claim 14,
wherein the voltage stabilization circuit comprises
a switch transistor having a control electrode, a first controlled electrode and a second controlled electrode; and
a biasing circuit comprising one or more sequentially coupled biasing elements, the biasing circuit having a first end coupled to the switching transistor and a second end coupled to the control electrode of the first pull-up high threshold voltage transistor and the control electrode of the second pull-up high threshold voltage transistor.

16. The circuit arrangement according to claim 15,
wherein the control electrode of the switch transistor is coupled to the first input electrode;
wherein the first controlled electrode of the switch transistor is coupled to the biasing circuit; and
wherein the second controlled electrode of the switch transistor is coupled to the second reference voltage.

17. The circuit arrangement according to claim 16,
wherein the switch transistor is configured to be activated when the first input voltage is in the first logic state.

18. The circuit arrangement according to claim 17,
wherein the one or more sequentially biasing elements comprises a biasing transistor at the second end of the biasing circuit, the biasing transistor having a control electrode, a first controlled electrode and a second controlled electrode;
wherein the control electrode of the biasing transistor is coupled to the first controlled electrode of the biasing transistor;
wherein the control electrode of the biasing transistor is further coupled to the control electrode of the first pull-up high-threshold voltage transistor and the control electrode of the second pull-up high-threshold voltage transistor;
wherein the biasing transistor is configured to be at least be partially activated when the reduction of the internal current causes a voltage at the control electrode of the first pull-up high-threshold voltage transistor and the control electrode of the second pull-up high-threshold voltage transistor to fall outside a predetermined range from the second reference voltage, so that the voltage at the control electrode of the first pull-up high-threshold voltage transistor and the control electrode of the second pull-up high-threshold voltage transistor is maintained at a predefined voltage.

19. The circuit arrangement according to claim 1, wherein the level-shifting stage comprises a current mirror.

20. A method of operating a circuit arrangement, the method comprising:
- coupling a level shifting stage to a first reference voltage and a second reference voltage;
- coupling a first input voltage to a first input electrode in electrical connection with the level shifting stage, the first input voltage configured to switch between a first logic state and a second logic state;
- coupling a second input voltage to a second input electrode in electrical connection with the level shifting stage, the second input voltage configured to switch between the first logic state and the second logic state;
- wherein the level shifting stage is coupled to an output stage, the output stage comprising an output node, the level shifting stage configured to generate an output voltage above a predetermined output level at the output node due to the first reference voltage when the first input voltage is in the first logic state and the second input voltage is in the second logic state; and the level shifting stage is further configured to generate the output voltage below the predetermined output level at the output node due to the second reference voltage when the first input voltage is in the second logic state and the second input voltage is in the first logic state;
- wherein a feedback circuit is coupled to the output stage and the level shifting stage;
- wherein a voltage stabilization circuit is coupled to the level shifting stage;
- wherein the level shifting stage comprises a switching mechanism configured to cause an internal current above a predetermined current level to flow through the level shifting stage due to the first reference voltage and the second reference voltage when the switching mechanism is activated, the switching mechanism further configured to at least reduce the internal current flowing through the level shifting stage to below the predetermined current level when the switching mechanism is deactivated;
- wherein the feedback circuit comprises a feedback mechanism configured to be deactivated when the output voltage is above the predetermined output level and the feedback mechanism is further configured to be activated when the output level is below the predetermined output level;
- wherein the switching mechanism is configured to be activated when the first input voltage is in the first logic state and when the feedback mechanism is activated; and the switching mechanism is further configured to be deactivated when the first input voltage is in the first logic state and when the feedback mechanism is deactivated; and
- wherein the voltage stabilization circuit is configured to maintain the output voltage at above the predetermined output level when the internal current flowing through the level shifting stage is reduced.

* * * * *